US011111578B1

(12) United States Patent
Elam et al.

(10) Patent No.: US 11,111,578 B1
(45) Date of Patent: Sep. 7, 2021

(54) ATOMIC LAYER DEPOSITION OF FLUORIDE THIN FILMS

(71) Applicant: UCHICAGO ARGONNE, LLC, Chicago, IL (US)

(72) Inventors: Jeffrey W. Elam, Elmhurst, IL (US); Anil U. Mane, Naperville, IL (US); Maximillian Gebhard, Westmont, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 16/790,559

(22) Filed: Feb. 13, 2020

(51) Int. Cl.
*C23C 16/30* (2006.01)
*C23C 16/44* (2006.01)
*H01J 37/285* (2006.01)
*C23C 16/455* (2006.01)

(52) U.S. Cl.
CPC .......... *C23C 16/30* (2013.01); *C23C 16/4408* (2013.01); *C23C 16/45527* (2013.01); *C23C 16/45553* (2013.01); *C23C 16/45555* (2013.01); *H01J 37/285* (2013.01)

(58) Field of Classification Search
USPC ....................................................... 250/310
See application file for complete search history.

(56) References Cited

U.S. PATENT DOCUMENTS

| | | | |
|---|---|---|---|
| 3,233,014 A | 2/1966 | Bickerdike et al. |
| 3,238,054 A | 3/1966 | Bickerdike et al. |
| 3,369,920 A | 2/1968 | Bourdeau et al. |
| 3,520,667 A | 7/1970 | Taylor |
| 3,537,426 A | 11/1970 | Spiller |
| 3,673,051 A | 6/1972 | Clark et al. |
| 3,673,457 A | 6/1972 | Sackinger et al. |
| 3,739,216 A | 6/1973 | Pakswer |
| 3,895,084 A | 7/1975 | Bauer |
| 3,991,248 A | 11/1976 | Bauer |
| 4,051,403 A | 9/1977 | Feingold et al. |
| 4,341,592 A | 7/1982 | Shortes et al. |
| 4,569,805 A | 2/1986 | Hume et al. |
| 4,625,106 A | 11/1986 | Bender et al. |
| 4,757,229 A | 7/1988 | Schmidt et al. |
| 4,853,020 A | 8/1989 | Sink |
| 4,894,160 A | 1/1990 | Abe et al. |
| 4,912,314 A | 3/1990 | Sink |
| 4,963,393 A | 10/1990 | Goela et al. |
| 5,039,357 A | 8/1991 | Epler et al. |
| 5,048,807 A | 9/1991 | Martinez et al. |
| 5,068,634 A | 11/1991 | Shrier |
| 5,086,248 A | 2/1992 | Horton et al. |
| 5,126,249 A | 6/1992 | Becker et al. |
| 5,141,775 A | 8/1992 | Patrigeon et al. |
| 5,154,948 A | 10/1992 | Patrigeon et al. |
| 5,160,544 A | 11/1992 | Garg et al. |
| 5,177,878 A | 1/1993 | Visser |
| 5,202,158 A | 4/1993 | Sakagami et al. |
| 5,216,249 A | 6/1993 | Jones et al. |
| 5,334,840 A | 8/1994 | Newacheck et al. |
| 5,350,480 A | 9/1994 | Gray |
| 5,378,960 A | 1/1995 | Tasker et al. |
| 5,391,101 A | 2/1995 | Aebi et al. |
| 5,402,034 A | 3/1995 | Blouch et al. |
| 5,472,650 A | 12/1995 | Johnson et al. |
| 5,480,678 A | 1/1996 | Rudolph et al. |
| 5,529,950 A | 6/1996 | Hoenlein et al. |
| 5,726,076 A | 3/1998 | Tasker et al. |
| 5,738,908 A | 4/1998 | Rey et al. |
| 5,820,686 A | 10/1998 | Moore |
| 5,904,957 A | 5/1999 | Christin et al. |
| 5,914,278 A | 6/1999 | Boitnott et al. |
| 5,916,633 A | 6/1999 | Lackey et al. |
| 5,945,177 A | 8/1999 | Hack et al. |
| 5,964,320 A | 10/1999 | Kato et al. |
| 5,997,713 A | 12/1999 | Beetz et al. |
| 6,197,374 B1 | 3/2001 | Huttinger et al. |
| 6,200,893 B1 | 3/2001 | Sneh |
| 6,300,640 B1 | 10/2001 | Bhargava et al. |
| 6,311,001 B1 | 10/2001 | Rosine |
| 6,420,279 B1 | 7/2002 | Ono et al. |
| 6,479,826 B1 | 11/2002 | Klann et al. |

(Continued)

FOREIGN PATENT DOCUMENTS

FR 2980486 A1 3/2013
GB 1 163 979 A 9/1969

(Continued)

OTHER PUBLICATIONS

Mane, "A novel atomic layer deposition method to fabricate economical and robust large area microchannel plates", Proc. SPIE 8031, Micro- and Nanotechnology Sensors, Systems, and Applications III, 80312H (May 13, 2011) (Year: 2011).*
T.J. Knisley, "Precursors and chemistry for the atomic layer deposition of metallic first row transition metal films", Elsevier, Coordination Chemistry Reviews, 257, Mar. 26, 2013, pp. 3222-3231 (Year: 2013).*
"Anopore Inorganic Membranes," Whatman Product Catalog, pp. 67-69 (2009).
Bjorck & Andersson, "GenX: an extensible X-ray reflectivity refinement program utilizing differential evolution," Journal of Applied Crystallography 40(6), pp. 1174-1178 (2007).

(Continued)

*Primary Examiner* — Phillip A Johnston
(74) *Attorney, Agent, or Firm* — Foley & Lardner LLP

(57) ABSTRACT

A secondary electron emissive coating. The coating is formed by atomic layer deposition of $CaF_2$ on a substrate by ALD half cycle exposure of an alkaline metal amidinate and ALD half cycle exposure of a fluorinated compound, where the deposition occurs at a reaction temperature greater than a highest sublimation temperature of the first metal precursor and the second metal precursor and less than 50° C. above the highest sublimation temperature.

10 Claims, 11 Drawing Sheets

(56) References Cited

U.S. PATENT DOCUMENTS

| | | | |
|---|---|---|---|
| 6,495,837 B2 | 12/2002 | Odom et al. | |
| 6,503,330 B1 | 1/2003 | Sneh et al. | |
| 6,545,281 B1 | 4/2003 | McGregor et al. | |
| 6,572,371 B1 | 6/2003 | Sion et al. | |
| 6,585,823 B1 | 7/2003 | Van Wijck | |
| 6,613,383 B1 | 9/2003 | George et al. | |
| 6,669,988 B2 | 12/2003 | Daws et al. | |
| 6,713,177 B2 | 3/2004 | George et al. | |
| 6,876,711 B2 | 4/2005 | Wallace et al. | |
| 6,913,827 B2 | 7/2005 | George et al. | |
| 7,164,138 B2 | 1/2007 | McGregor et al. | |
| 7,233,007 B2 | 6/2007 | Downing et al. | |
| 7,335,594 B1 | 2/2008 | Wang et al. | |
| 7,557,229 B2* | 7/2009 | Gordon | C07C 257/14 427/255.19 |
| 7,595,270 B2 | 9/2009 | Elers et al. | |
| 7,759,138 B2 | 7/2010 | Beaulieu et al. | |
| 7,842,214 B2 | 11/2010 | Romdhane et al. | |
| 7,855,493 B2 | 12/2010 | Sullivan et al. | |
| 7,892,646 B1 | 2/2011 | Rudolph et al. | |
| 7,972,569 B2 | 7/2011 | Elam et al. | |
| 7,977,617 B2 | 7/2011 | Sullivan et al. | |
| 7,981,472 B2 | 7/2011 | Dalton et al. | |
| 8,052,884 B2 | 11/2011 | Sullivan et al. | |
| 8,101,480 B1 | 1/2012 | Kim et al. | |
| 8,344,241 B1 | 1/2013 | Vidu et al. | |
| 8,404,878 B2* | 3/2013 | Pallem | C23C 16/18 556/56 |
| 8,604,440 B2 | 12/2013 | Frisch et al. | |
| 8,969,823 B2 | 3/2015 | Elam et al. | |
| 9,255,327 B2* | 2/2016 | Winter | C07F 15/065 |
| 9,263,689 B2* | 2/2016 | O'Carroll | H01L 51/5225 |
| 9,382,615 B2* | 7/2016 | Mantymaki | C23C 16/45527 |
| 9,704,900 B1 | 7/2017 | Xia et al. | |
| 10,497,530 B2* | 12/2019 | Feigelson | H01J 1/28 |
| 10,515,798 B2* | 12/2019 | Park | H01L 29/66969 |
| 10,796,874 B2 | 10/2020 | Wagner et al. | |
| 2001/0000104 A1 | 4/2001 | Li et al. | |
| 2001/0037761 A1 | 11/2001 | Ries et al. | |
| 2002/0021064 A1 | 2/2002 | Devoe et al. | |
| 2002/0042344 A1 | 4/2002 | Kondo et al. | |
| 2002/0067789 A1 | 6/2002 | Wallace et al. | |
| 2002/0076491 A1 | 6/2002 | Delperier et al. | |
| 2002/0088714 A1 | 7/2002 | Motoi et al. | |
| 2003/0054149 A1 | 3/2003 | Pan | |
| 2003/0091788 A1 | 5/2003 | Schroder et al. | |
| 2003/0118728 A1 | 6/2003 | Sion et al. | |
| 2003/0138560 A1 | 7/2003 | Zhao et al. | |
| 2003/0205203 A1 | 11/2003 | Sion et al. | |
| 2004/0028813 A1 | 2/2004 | Thebault et al. | |
| 2004/0045932 A1 | 3/2004 | Kochergin et al. | |
| 2004/0083967 A1 | 5/2004 | Yuda et al. | |
| 2004/0087168 A1 | 5/2004 | Granneman et al. | |
| 2004/0134879 A1 | 7/2004 | Kochergin et al. | |
| 2004/0253377 A1 | 12/2004 | Bok et al. | |
| 2004/0255843 A1 | 12/2004 | Yoshida et al. | |
| 2005/0082007 A1 | 4/2005 | Nguyen et al. | |
| 2005/0133166 A1 | 6/2005 | Satitpunwaycha et al. | |
| 2006/0046059 A1 | 3/2006 | Arico et al. | |
| 2006/0062910 A1 | 3/2006 | Meiere | |
| 2006/0096911 A1 | 5/2006 | Brey et al. | |
| 2006/0193979 A1* | 8/2006 | Meiere | C23C 18/12 427/226 |
| 2006/0263525 A1 | 11/2006 | Sion et al. | |
| 2007/0031609 A1 | 2/2007 | Kumar et al. | |
| 2007/0131849 A1 | 6/2007 | Beaulieu et al. | |
| 2007/0217119 A1 | 9/2007 | Johnson et al. | |
| 2007/0259130 A1 | 11/2007 | Von Kaenel et al. | |
| 2007/0264840 A1 | 11/2007 | Itatani et al. | |
| 2008/0066684 A1 | 3/2008 | Patalay et al. | |
| 2008/0069951 A1 | 3/2008 | Chacin et al. | |
| 2008/0113097 A1 | 5/2008 | Mahajani et al. | |
| 2008/0124462 A1 | 5/2008 | Waghray et al. | |
| 2008/0223795 A1 | 9/2008 | Bakajin et al. | |
| 2008/0237919 A1 | 10/2008 | Liu et al. | |
| 2008/0241503 A1 | 10/2008 | Romdhane et al. | |
| 2008/0286448 A1 | 11/2008 | Elam et al. | |
| 2009/0137043 A1 | 5/2009 | Parsons et al. | |
| 2009/0194233 A1 | 8/2009 | Tamura et al. | |
| 2009/0206057 A1 | 8/2009 | Huang et al. | |
| 2009/0212680 A1 | 8/2009 | Tremsin et al. | |
| 2009/0215211 A1 | 8/2009 | Tremsin et al. | |
| 2009/0315443 A1 | 12/2009 | Sullivan et al. | |
| 2009/0324829 A1 | 12/2009 | Dalton et al. | |
| 2010/0044577 A1 | 2/2010 | Sullivan et al. | |
| 2010/0068132 A1 | 3/2010 | Vencill et al. | |
| 2010/0075131 A1 | 3/2010 | Etzel et al. | |
| 2010/0075445 A1* | 3/2010 | Beaulieu | H01J 31/507 438/20 |
| 2010/0075560 A1 | 3/2010 | Seshadri et al. | |
| 2010/0080841 A1 | 4/2010 | Porbeni et al. | |
| 2010/0093527 A1 | 4/2010 | Hasselmann | |
| 2010/0178468 A1 | 7/2010 | Jiang et al. | |
| 2010/0189900 A1 | 7/2010 | Dickey et al. | |
| 2011/0220802 A1 | 9/2011 | Frisch et al. | |
| 2011/0229838 A1 | 9/2011 | Kalgutkar et al. | |
| 2011/0253046 A1 | 10/2011 | Dalton et al. | |
| 2011/0268624 A1 | 11/2011 | Chandler et al. | |
| 2012/0000886 A1 | 1/2012 | Honda et al. | |
| 2012/0070794 A1 | 3/2012 | Craig et al. | |
| 2012/0171376 A1 | 7/2012 | Dodge | |
| 2012/0171403 A1 | 7/2012 | Dodge | |
| 2012/0187305 A1 | 7/2012 | Elam et al. | |
| 2012/0308739 A1* | 12/2012 | Lansalot-Matras | C23C 16/30 427/569 |
| 2013/0001156 A1 | 1/2013 | Takeno | |
| 2013/0014799 A1 | 1/2013 | Vidu et al. | |
| 2013/0025538 A1 | 1/2013 | Collins et al. | |
| 2013/0048629 A1 | 2/2013 | Kang et al. | |
| 2013/0186452 A1 | 7/2013 | Argo et al. | |
| 2013/0189810 A1 | 7/2013 | Argo et al. | |
| 2013/0263776 A1 | 10/2013 | Pitney et al. | |
| 2013/0280546 A1 | 10/2013 | Elam et al. | |
| 2013/0335190 A1 | 12/2013 | Elam et al. | |
| 2014/0106070 A1 | 4/2014 | Mantymaki et al. | |
| 2014/0220244 A1 | 8/2014 | Mane et al. | |
| 2014/0225091 A1 | 8/2014 | O'Carroll et al. | |
| 2014/0272432 A1 | 9/2014 | Dodge et al. | |
| 2015/0125599 A1* | 5/2015 | Lindfors | C23C 16/45555 427/213 |
| 2018/0273550 A1* | 9/2018 | Gordon | C07F 1/00 |
| 2019/0379056 A1 | 12/2019 | Chen | |

FOREIGN PATENT DOCUMENTS

| | | |
|---|---|---|
| JP | 2000-182979 A | 6/2000 |
| JP | 2001-247970 A | 9/2001 |
| JP | 2005-306625 A | 11/2005 |
| JP | 2007-277105 A | 10/2007 |
| WO | WO-2009/045752 A2 | 4/2009 |
| WO | WO-2011/037798 A1 | 3/2011 |
| WO | WO-2011/037831 A2 | 3/2011 |
| WO | WO-2011/122059 A1 | 10/2011 |
| WO | WO-2012/099658 A2 | 7/2012 |
| WO | WO-2013/045788 A1 | 4/2013 |
| WO | WO-2013/066749 A1 | 5/2013 |
| WO | WO-2013/140021 A1 | 9/2013 |
| WO | WO-2013/171360 A1 | 11/2013 |
| WO | WO-2016/037656 A1 | 3/2016 |

OTHER PUBLICATIONS

Elam, et al., "Conformal coating on ultrahigh-aspect-ratio nanopores of anodic alumina by atomic layer deposition," Chemistry of Materials 15(18), pp. 3507-3517 (2003).

Faubert, et al., "Activation and charactterization of Fe-based catalysts for the reduction of oxygen in polymer electrolyte fuel cells," Electrochimica Acta 43(14-15), pp. 1969-1984 (1998).

Final Office Action for U.S. Appl. No. 14/175,396 dated Dec. 27, 2018.

George, "Fabrication and Properties of Nanolaminates Using Self-Limiting Surface Chemistry Techniques," University of Colorado

(56) References Cited

OTHER PUBLICATIONS

Department of Chemistry and Biochemistry, ADA415471, 21 pages (2003).
International Search Report & Written Opinion for PCT/US2011/064593 dated Jul. 11, 2012, 10 pages.
Jaouen, et al., "Cross-Laboratory Experimental Study of Non-Noble-Metal Electrocatalysts for the Oxygen Reduction Reaction", Applied Materials and Interfaces 1(8), pp. 1623-1639 (2009).
Kim, et al., "Synthesis of Calcium (II) Amidinate Precursors for Atomic Layer Deposition through a Redox Reaction between Calcium and Amidines," Angewandte Chemie 55(35), pp. 10228-10233 (2016).
Lee & George, "Atomic Layer Etching of Al2O3 Using Sequential, Self-Limiting Thermal Reactions with Sn(acac)2 and Hydrogen Fluoride," ACS Nano 9(2), pp. 2061-2070 (2015).
Lee, et al., "Atomic Layer Deposition of Metal Fluorides Using HF-Pyridine as the Fluorine Precursor," Chemistry of Materials 28(7), pp. 2022-2032 (2016).
Lefevre & Dodelet, "Fe-based catalysts for the reduction of oxygen in polymer electrolyte membrane fuel cell conditions: determination of the amount of peroxide released during electroreduction and its influence on the stability of the catalysts", Electrochimica Acta 48(19), pp. 2749-2760 (2003).
Lefevre, et al., "Iron-Based Catalysts with Improved Oxygen Reduction Activity in Polymer Electrolyte Fuel Cells", Science 324(5923), pp. 71-74 (2009).
Ma, et al., "Cobalt Imidazolate Framework as Precursor for Oxygen Reduction Reaction Electroatalysts," Chemistry: A European Journal 17(7), pp. 2063-2067 (2011).
Mahurin, et al., "Atomic Layer Deposition of TiO2 on Mesoporous Silica," Journal of Non-Crystalline Solids 352(30-31), pp. 3280-3284 (2006).
Mane & Elam, "Atomic Layer Deposition of W:Al2O3 Nanocomposite Films with Tunable Resistivity," Chemical Vapor Deposition 19(4-6), pp. 186-193 (2013).
Mane, et al., "Atomic Layer Deposition of Nanostructured Tunable Resistance Coatings: Growth, Characterization, and Electrical Properties," ECS Transactions 64(9), pp. 3-14 (2014).
Mantymaki, et al., "Metal Fluorides as Lithium-Ion Battery Materials: An Atomic Layer Deposition Perspective," Coatings 8(8), 277, 40 pages (2018).
Meng, et al., "Emerging Applications of Atomic Layer Deposition for Lithium-Ion Battery Studies," Advanced Materials 24(27), pp. 3589-3615 (2012).
Meng, et al., "SWCNT-Supported Amorphous Gallium Sulfide as a New High-Performance Anode for Lithium-Ion Batteries," 223rd Electrochemical Society Meeting, Abstract #388, 1 page (2013).
Minot, et al., "Pilot production and advanced development of large-area picosecond photodetectors," Proceedings of SPIE 9968, 14 pages (2016).
Non-Final Office Action for U.S. Appl. No. 14/175,396 dated Jul. 29, 2019.
Pham, et al., "Improved Hydrothermal Stability of Niobia-Supported Pd Catalysts," Applied Catalysis A: General 397(1-2), pp. 153-162, pp. 153-162 (2011).
Pilvi, et al., "Atomic layer deposition process with TiF4 as a precursor for depositing metal fluoride thin films," Applied Optics 47(13), pp. C271-C274 (2008).
Pilvi, et al., "Novel ALD Process for Depositing CaF2 Thin Films," Chemistry of Materials 19(14), pp. 3387-3392 (2007).
Putkonen, et al., "Atomic layer deposition of metal fluorides through oxide chemistry," Journal of Materials Chemistry 21(38), pp. 14461-14465 (2011).
Ritala, et al., "Rapid Coating of Through-Porous Substrates by Atomic Layer Deposition," Chemical Vapor Deposition 12(11), pp. 655-658 (2006).
Schroeder, et al., "Epitaxial growth of laminar crystalline silicon on CaF2," Applied Physics Letters 77(9), 1289-1291 (2000).
Siegmund, et al., "Microchannel plate detector technology potential for LUVOIR and HabEx," Proceedings of SPIE 10397, 14 pages (2017).
Sumiya, et al., "Initial growth stages of CaF2 on Si(111) investigated by scanning tunneling microscopy," Applied Surface Science 156(1-4), pp. 85-96 (2000).
Tong, et al., "Nanoclusters of MoO3-x embedded in an Al2O3 matrix engineered for customizable mesoscale resistivity and high dielectric strength," Applied Physics Letters 102, 252901, 5 pages (2013).
U.S. Office Action for U.S. Appl. No. 14/175,396 dated Mar. 12, 2018.
U.S. Office Action for U.S. Appl. No. 14/175,396 dated Jul. 20, 2016.
Wind, et al., "Nucleation period, surface roughness, and oscillations in mass gain per cycle during W atomic layer deposition on Al2O3," Journal of Applied Physics 105, 074309, 13 pages (2009).
Wu, et al., "High-Performance Electrocatalysts for Oxygen Reduction Derived from Polyaniline, Iron, and Cobalt," Science 332(6028), pp. 443-447 (2011).
Ylilammi & Ranta-Aho, "Metal Fluoride Thin Films Prepared by Atomic Layer Deposition," Journal of the Electrochemical Society 141(5), pp. 1278-1284 (1994).
Brown, et al., "Improved flexibility with grayscale fabrication of calcium fluoride homogenizers," Proceedings of SPIE 8326, 11 pages (2012).
Ertley, et al., "Microchannel plate detectors for future NASA UV observatories," Proceedings of SPIE 10699, 13 pages (2018).
Mane & Elam, et al., "Nanostructured composite thin films with tailored resistivity by atomic layer deposition," Proceedings of SPIE 8818, 8 pages (2013).
Mane, et al., "Creation of economical and robust large area MCPs by ALD method for photodetectors," Proceedings of SPIE 9968, 11 pages (2016).
Mironova & Gradusova, "Measurements of the refractometric characteristics of optical materials in the 248-5000-nm spectral region," Journal of Optical Technology 79(2), pp. 112-115 (2012).
Niskanen, et al., "Refractive index retrieval from transmittance measurements," Optik 127(14), pp. 5562-5567 (2016).
Sang, et al., "Suppression in the electrical hysteresis by using CaF2 dielectric layer for p-GaN MIS capacitors," Journal of Applied Physics 123, 161423 (2018).
Shi, et al., "Structure and electrochemical performance of CaF2 coated LiMn1/3Ni1/3Co1/3O2 cathode material for Li-ion batteries," Electrochimica Acta 83, pp. 105-112 (2012).
Attenkofer, et al., "A New Approach to Photocathode Development: From the Recipe to Theory Inspired Design," 6th International Conference on New Developments in Photon Detection, retrieved from http://lappddocs.uchicago.edu/documents/200 15 pages (2011).
Byrum, "Development of Large Area Fast Microchannel Plate Photodetectors," SPIE 2011 Defense Security & Sensing, retrieved from http://lappddocs.uchicago.edu/documents/189, 35 pages (2011).
Elagin, "Performance of Microchannel Plates Fabricated Using Atomic Layer Deposition," IEEE Symposium on Radiation Measurements and Applications, retrieved from http://lappddocs.uchicago.edu/documents/186, 15 pages (2012).
Ivanov, et al., "Simulation of gain and timing resolution in saturated pores," Nuclear Instruments and Methods in Physics Research Section A: Accelerators, Spectrometers, Detectors and Associated Equipment 639(1), pp. 158-161 (2011).
Mane, et al., "A novel atomic layer deposition method to fabricate economical and robust large area microchannel plates for photodetectors," 2nd International Conference on Technology and Instrumentation in Particle Physics, retrieved from https://indico.cern.ch/event/102998/contributions/17033/attachments/10453, 28 pages (2011).
Mane, et al., "A novel atomic layer deposition method to fabricate economical and robust large area microchannel plates," Proceedings of SPIE 8031, 80312H, 7 pages (2011).
Mane, et al., "An Atomic Layer Deposition Method to Fabricate Economical and Robust Large Area Microchannel Plates for Photodetectors," Physics Procedia 37, pp. 722-732 (2012).

(56) References Cited

OTHER PUBLICATIONS

Oberla, et al., "A 4-Channel Waveform Sampling ASIC in 0.13 μm CMOS for front-end Readout of Large-Area Micro-Channel Plate Detectors," Physics Procedia 37, pp. 1690-1698 (2012).
Siegmund, "Ultrafast Large Area Vacuum Detectors: Part I," Seminario Nazionale Rivelatori Innovativi, retrieved from https://agenda.infn.it/event/4542/contributions/53649/attachments/38415/, 37 pages (2012).
Siegmund, "Ultrafast Large Area Vacuum Detectors: Part II," Seminario Nazionale Rivelatori Innovativi, retrieved from https://agenda.infn.it/event/4542/contributions/53652/attachments/38399/, 43 pages (2012).
Siegmund, et al., "Advances in microchannel plates and photocathodes for ultraviolet photon counting detectors," SPIE Proceedings 8145, 81450J, 12 pages (2011).
Siegmund, et al., "Advances in Microchannel Plates for Sealed Tube Detectors," Light 11: Workshop on the Latest Developments of Photon Detectors, retrieved from http://lappddocs.uchicago.edu/documents/201, 17 pages (2011).
Siegmund, et al., "Atomic Deposited Borosilicate Glass Microchannel Plates for Large Area Event Counting Detectors," 6th International Conference on New Developments in Photon Detection, retrieved from http://lappddocs.uchicago.edu/documents/199, 15 pages (2011).
Siegmund, et al., "Atomic layer deposited borosilicate glass microchannel plates for large area event counting detectors," Nuclear Instruments and Methods in Physics Research Section A: Accelerators, Spectrometers, Detectors and Associated Equipment 695, pp. 168-171 (2012).
Siegmund, et al., "Development of Large Area Photon Counting Detectors Optimized for Cherenkov Light Imaging with High Temporal and sub-mm Spatial Resolution," 2011 IEEE Nuclear Science Symposium Conference Record, retrieved from http://lappddocs.uchicago.edu/documents/202, 8 pages (2011).
Siegmund, et al., "Large Area Photodetector Development Project at Space Sciences Laboratory (SSL)," SLAC National Accelerator Laboratory, retrieved from http://lappddocs.uchicago.edu/documents/195, 28 pages (2009).
Wagner, "Development of a Lower Cost Large Area Microchannel Plate Photodetector," Workshop on the Latest Developments of Photon Detectors, retrieved from http://lappddocs.uchicago.edu/documents/205, 25 pages (2011).
Wetstein, et al., "Systems-Level Characterization of Microchannel Plate Detector Assemblies, using a Pulsed sub-Picosecond Laser," Physics Procedia 37, pp. 748-756 (2012).
Ahmed, et al., "Electrode surface engineering by atomic layer deposition: A promising pathway toward better energy storage," Nano Today 11 (2), pp. 250-271 (2016).
Andres, et al., "Decoupling of optoelectronic properties from morphological changes in sodium treated kesterite thin film solar cells," Solar Energy 175, pp. 94-100 (2018).
Biemolt, et al., "Beyond Lithium-Based Batteries," Materials 13(2), 425, 31 pages (2020).
Binions, et al., "Aerosol-assisted chemical vapour deposition of sodium fluoride thin films," Thin Solid Films 469-470, pp. 416-419 (2004).
Chen, et al., "Novel ALD Chemistry Enabled Low-Temperature Synthesis of Lithium Fluoride Coatings for Durable Lithium Anodes," ACS Applied Materials & Interfaces 10(32), pp. 26972-26981 (2018).
Elam, et al., "Viscous Flow Reactor with Quartz Crystal Microbalance for Thin Film Growth by Atomic Layer Deposition," Review of Scientific Instruments 73(8), pp. 2981-2987 (2002).
Elam, et al., "ZnO/Al2O3 nanolaminates fabricated by atomic layer deposition: growth and surface roughness measurements," Thin Solid Films 414(1), pp. 43-55 (2002).
Feinauer, et al., "Unlocking the Potential of Fluoride-Based Solid Electrolytes for Solid-State Lithium Batteries," ACS Applied Energy Materials 2(10), pp. 7196-7203 (2019).

George, "Atomic layer deposition: an overview," Chemical Reviews 110(1), pp. 111-131 (2010).
Hwang, et al., "NaF-FeF2 nanocomposite: New type of Na-ion battery cathode material," Nano Research 10, pp. 4388-4397 (2017).
Iwahori, et al., "Optical properties of fluoride thin films deposited by RF magnetron sputtering," Applied Optics 45(19), pp. 4598-4602 (2006).
Jokela, et al., "Secondary Electron Yield of Emissive Materials for Large-Area Micro-Channel Plate Detectors: Surface Composition and Film Thickness Dependencies," Physics Procedia 37, pp. 740-747 (2012).
Ledinek, et al., "Effect of NaF pre-cursor on alumina and hafnia rear contact passivation layers in ultra-thin Cu(ln,Ga)Se2 solar cells," Thin Solid Films 683, pp. 156-164 (2019).
Li, et al., "Cation and anion immobilization through chemical bonding enhancement with fluorides for stable halide perovskite solar cells," Nature Energy 4, pp. 408-415 (2019).
Lingg, et al., "Sodium fluoride thin films by chemical vapor deposition," Thin Solid Films 209(1), pp. 9-16 (1992).
Liu, et al., "Toward 3D Solid-State Batteries via Atomic Layer Deposition Approach," Frontiers in Energy Research 6, 10, 5 pages (2018).
Luo, et al., "Na-Ion Battery Anodes: Materials and Electrochemistry," Accounts of Chemical Research 49(2), pp. 231-240 (2016).
Ma, et al., "Atomic Layer Deposition for Lithium-Based Batteries," Advanced Materials Interfaces 3(21), 1600564, 15 pages (2016).
Mahuli, et al., "Atomic layer deposition of aluminum oxyfluoride thin films with tunable stoichiometry," Journal of Vacuum Science & Technology A 38:022407, 10 pages (2020).
Necas & Klapetek, "Gwyddion: an open-source software for SPM data analysis," Open Physics 10(1), pp. 181-188 (2012).
Ostreng, et al., "Atomic layer deposition of sodium and potassium oxides: evaluation of precursors and deposition of thin films," Dalton Transactions 43, pp. 16666-16672 (2014).
Pu, et al., "Recent Progress in Rechargeable Sodium-Ion Batteries: toward High-Power Applications," Small 15(32), 1805427, 33 pages (2019).
Rajan, et al., "Impact of Post-Deposition Recrystallization by Alkali Fluorides on Cu(ln,Ga)Se2Thin-Film Materials and Solar Cells," Thin Solid Films 690, 137526, 5 pages (2019).
Samuels, et al., "Chemical Vapor Deposition of Metal Fluorides Using Sodium and Zirconium Fluoroalkoxides," Chemistry of Materials 6(1), pp. 1684-1692 (1994).
Seh, et al., "A Highly Reversible Room-Temperature Sodium Metal Anode," ACS Central Science 1 (8), pp. 449-455 (2015).
Sonsteby, et al., "Atomic layer deposition of (K,Na)(Nb,Ta)03 thin films," Journal of Vacuum Science & Technology A 34, 041508, 7 pages (2016).
Sonsteby, et al., "Chemical Uniformity in Ferroelectric KxNa1-xNbO3 Thin Films," Global Challenges 3(10), 1800114, 6 pages (2019).
Sonsteby, et al., "tert-butoxides as precursors for atomic layer deposition of alkali metal containing thin films," Journal of Vacuum Science & Technology A 38, 060804, 15 pages (2020).
Walter, et al., "Challenges and benefits of post-lithium-ion batteries," New Journal of Chemistry 44, pp. 167-1683 (2020).
Wu, et al., "Guidelines and trends for next-generation rechargeable lithium and lithium-ion batteries," Chemical Society Reviews 49(5), pp. 1569-1614 (2020).
Yu, et al., "Electrode Engineering by Atomic Layer Deposition for Sodium-Ion Batteries: From Traditional to Advanced Batteries," Advanced Functional Materials 30(9), 1906890, 28 pages (2020).
Zhao, et al., "Addressing Interfacial Issues in Liquid-Based and Solid-State Batteries by Atomic and Molecular Layer Deposition," Joule 2(12), pp. 2583-2604 (2018).
Zuo, et al., "Recent progress in surface coating of cathode materials for lithium ion secondary batteries," Journal of Alloys and Compounds 706, pp. 24-40 (2017) (68 pages accepted manuscript provided).

* cited by examiner

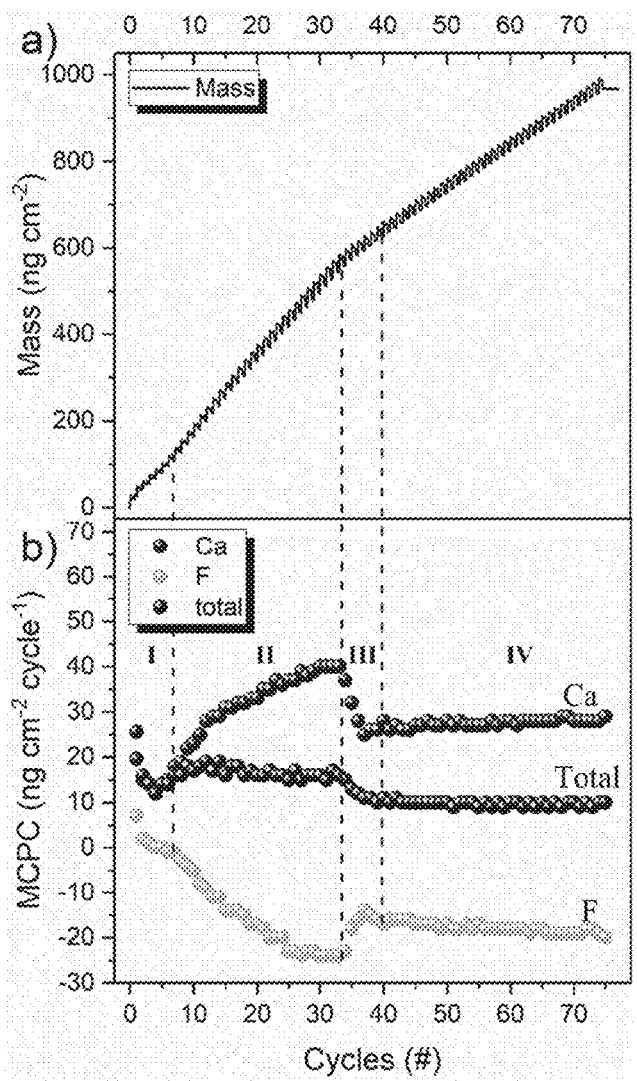
FIG. 3A
FIG. 3B
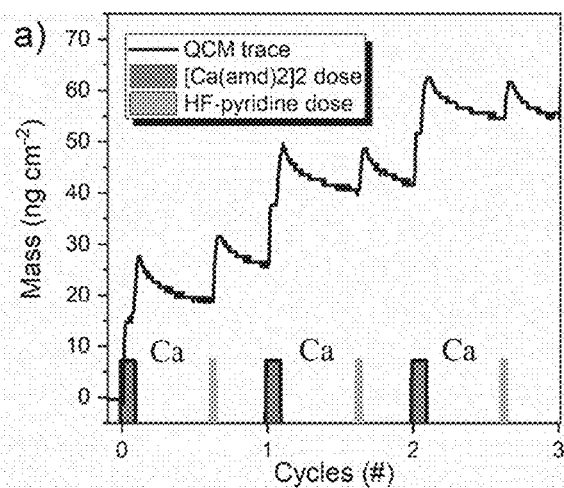
FIG. 4A
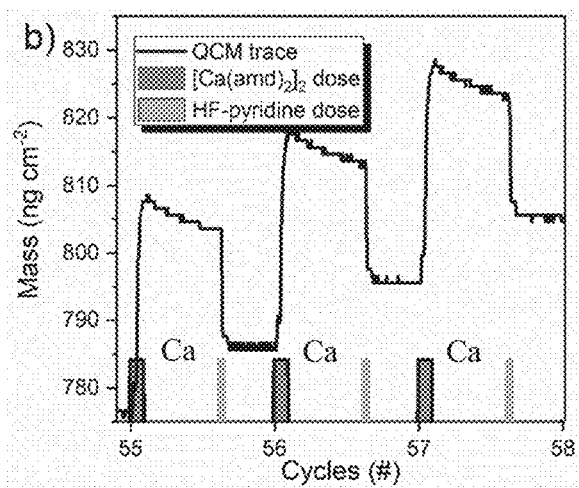
FIG. 4B

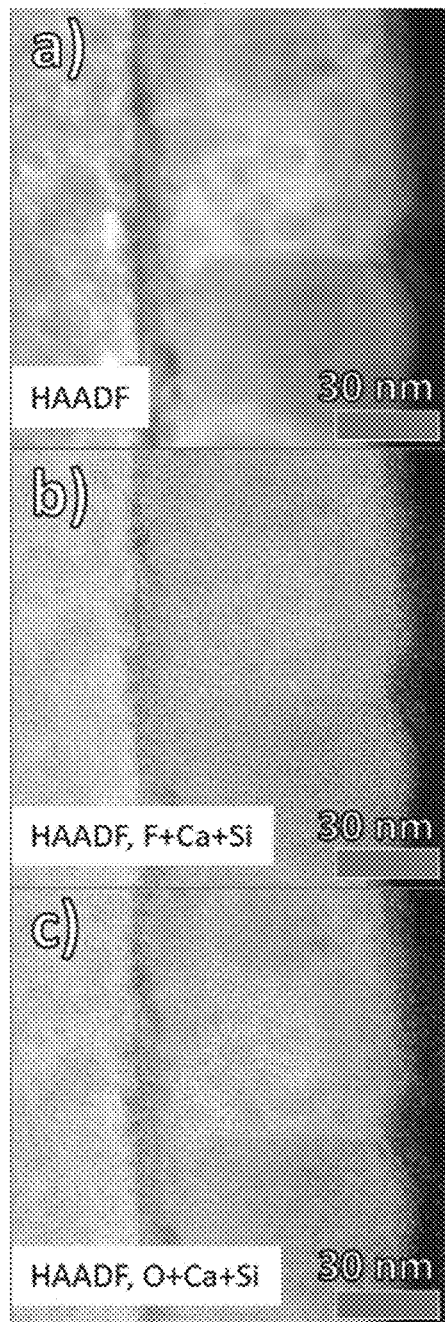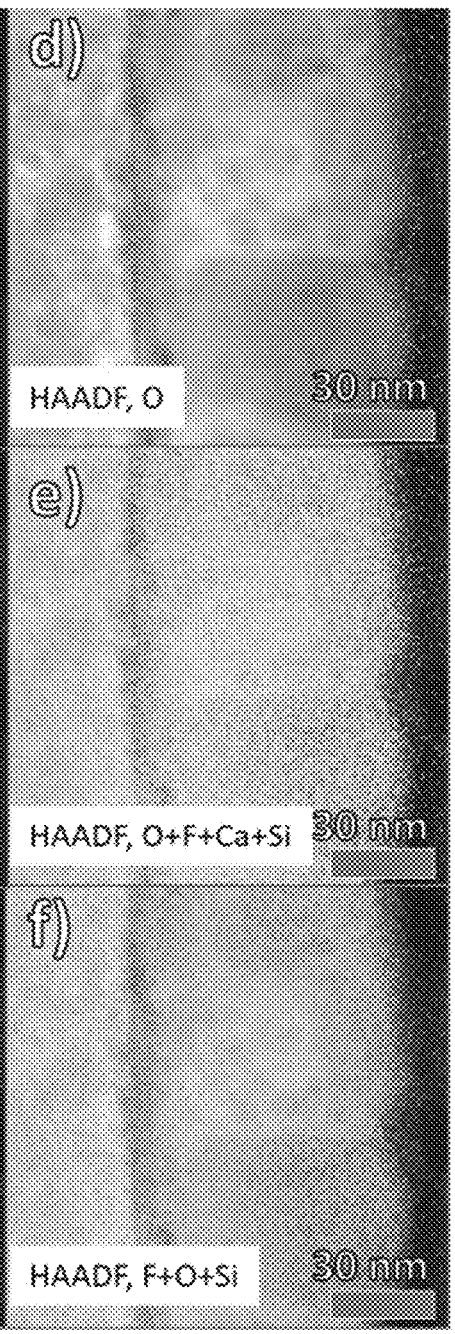
FIG. 14A  FIG. 14B  FIG. 14C  FIG. 14D  FIG. 14E  FIG. 14F

ATOMIC LAYER DEPOSITION OF FLUORIDE THIN FILMS

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to atomic layer deposition, specifically deposition of fluoride thin films.

BACKGROUND

Thin layer deposition of material provides the ability to modify substrates or templates to have specific desired properties. For example, the alkaline earth metal fluorides $MgF_2$, $CaF_2$, $BaF_2$, and $SrF_2$ share the fascinating property of exhibiting high transparency, ranging from wavelengths in vacuum ultraviolet ("VUV") to the long infrared spectrum, covering wavelengths from 150 nm to 11 μm. As a result, these materials have found uses in a range of optical applications. Calcium fluoride is of particular interest for optical applications because of its low refractive index (n<1.46).

While various deposition techniques have been used with alkaline earth metal fluorides, including $CaF_2$, (e.g., molecular-beam epitaxy ("MBE"), electron beam evaporation ("EBE"), thermal evaporation, pulsed laser deposition ("PLD"), and chemical vapor deposition ("CVD")), the use of atomic layer deposition ("ALD") has proved difficult for these materials. Further, in order to accommodate a range of underlying substrates and avoid altering of the overall properties, particularly optical properties, the temperature of the deposition process is considered. Prior reports regarding ALD of alkaline earth metal fluorides have been above 200° C., such as 200-450° C. There remains a need for a lower temperature, such as sub-225° C. or sub-200° C. ALD deposition process for alkaline earth metal fluorides.

SUMMARY

At least one embodiment relates to a method of forming a secondary electron emissive ("SEE") coating. A substrate is provided within an ALD reactor. A coating of $CaF_2$ is deposited by atomic layer deposition process including at least one cycle of: pulsing a first metal precursor comprising an alkaline metal amidinate into the reactor for a first metal precursor pulse time; purging the reactor of the first metal precursor; pulsing a second precursor comprising a fluorinated compound into the reactor for a second precursor pulse time; and purging the reactor of the co-reactant precursor. The depositing occurs at a reaction temperature greater than a highest sublimation temperature of the first metal precursor and the second metal precursor and less than 50° C. above the highest sublimation temperature.

Another embodiment relates to method of forming an electron amplifier. An electron amplifier substrate having an emissive layer and a resistive layer is provided within an ALD reactor. A coating of $CaF_2$ is deposited by atomic layer deposition process including at least one cycle of: pulsing a first metal precursor comprising $[Ca(amd)_2]_2$ into the reactor for a first metal precursor pulse time; purging the reactor of the first metal precursor; pulsing a second precursor selected from the group consisting of hydrogen fluoride ("HF"), HF-pyridine ("HF-Py"), $WF_6$, $TaF_5$, $MoF_6$, and $NbF_5$ into the reactor for a second precursor pulse time; and purging the reactor of the second precursor.

Another embodiment relates to an electron detector device comprising a microchannel plate having a plurality of channels extending therethrough. A resistive coating is deposited on the microchannel plate. The device further includes an emissive coating deposited on the resistive coating; the emissive coating comprising $CaF_2$.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

FIGS. 2A-2B show mass change per cycle ("MCPC") (or mass grown per cycle ("MGPC")) for saturation studies of the two precursors Ca and HF, respectively.

FIG. 2C is a plot of MCPC vs. growth temperature. FIG. 2D shows thin film thickness vs. applied number of cycles. The linear fit (dashed line) serves to guide the eye.

FIGS. 3A-3B show QCM studies during nucleation phase of $CaF_2$ ALD on an $Al_2O_3$-coated QCM crystal. A feeding sequence of 3.0 sec-15.0 sec-1.0 sec-10 sec was applied at 225° C.

FIGS. 4A-4B show enlarged areas of QCM nucleation studies (from FIG. 3A) for the ALD of $CaF_2$ on $Al_2O_3$. FIG. 4A shows initial three cycles; FIG. 4B shows steady-state regime (from FIG. 3B). Blue and green rectangles indicate the dose times of the two precursors.

FIGS. 14A-14F are HAADF overlaid images for the elements Ca, F, O, and Si.

DETAILED DESCRIPTION

In one embodiment, ALD is utilized. In its simplest form, ALD is a half-reaction or half-cycle, two-step process where, in a first half-cycle, a first precursor binds to the surface of the material to be etched (adsorption), the first precursor is purged, and then, in a second half-cycle, a second precursor (or co-reactant) is added to react with the adsorbed/bound intermediate entity formed by the first precursor. The reaction of the second precursor with the first adsorbed entity forms a deposited material.

Figure 1:
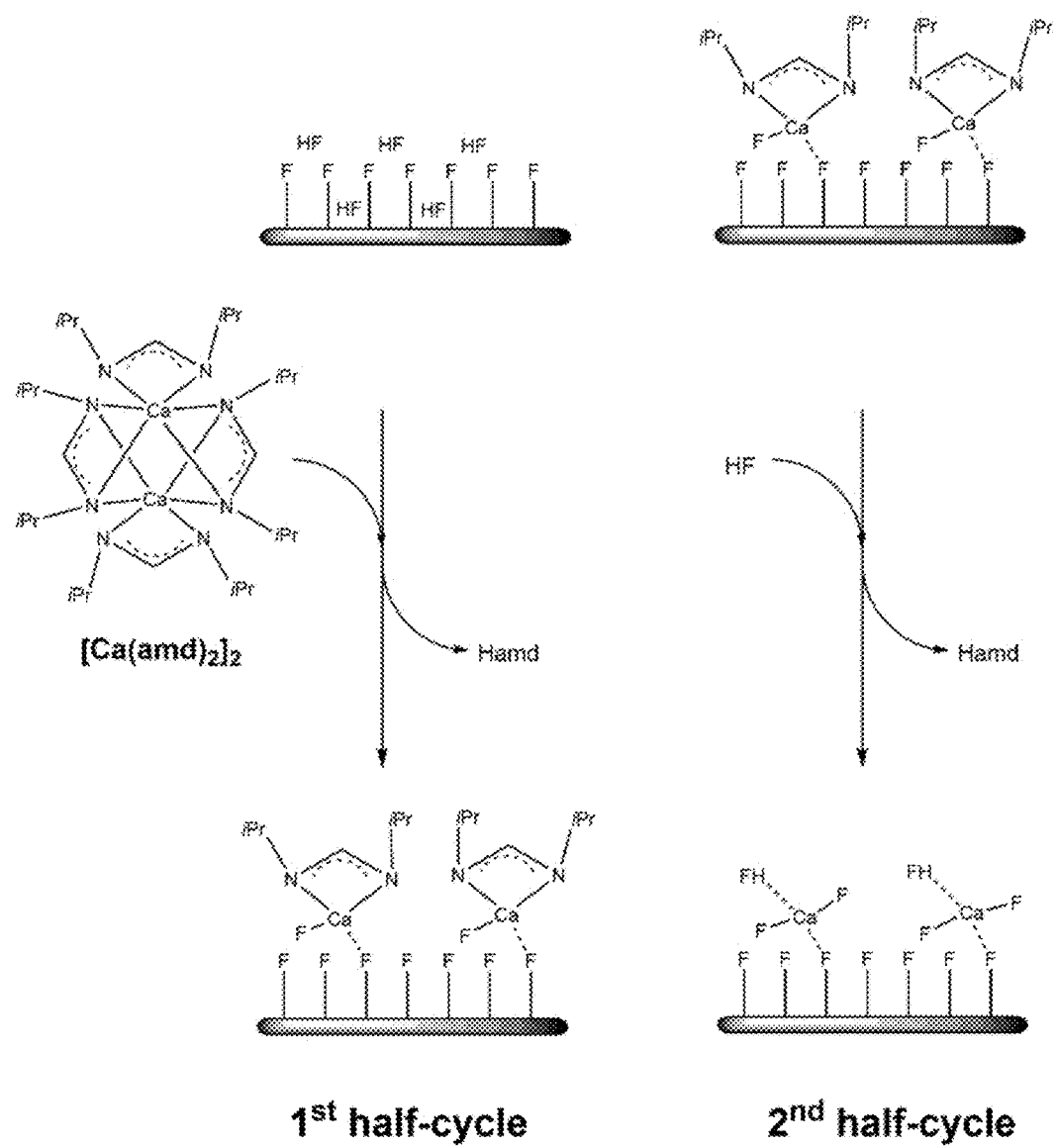
FIG. 1 shows one embodiment of an ALD process for deposition of $CaF_2$ employing $[Ca(amd)_2]_2$ and HF precursors.

In one embodiment, the general ALD process includes a substrate that is reacted with an alkaline metal precursor in the first half reaction to form a first intermediate entity having the alkaline metal from the alkaline metal precursor. In a second half reaction, second precursor, such as a fluorine containing reducing agent, is exposed to the first intermediate entity and reacted to form the alkaline metal fluoride. FIG. 1 illustrates one embodiment of such a process, where the alkaline metal fluoride form is $CaF_2$.

The ALD occurs with a substrate serving as the initial deposition surface. The substrate may be an aluminum compound. As starting surface is key point for many ALD deposition, the substrate surface should be considered. For example, embodiments relating to fluoride layer growth will benefit from F-terminated surfaces to react Ca precursor (e.g., $AlF_3$ surface). Secondly, surface nature can define the nucleation delay (few-to-many initial ALD cycles) for the process until the process achieves steady state growth of the ALD layer. Note that the $Al_2O_3$ or silicon surface is mostly OH terminated and favors fluoride growth due to strong interaction with subsequent fluorine-based precursor dose.

The ALD process includes a first metal precursor. In one embodiment, the first metal precursor comprises an amidinate, such as calcium amidinate ($[Ca(amd)_2]_2$).

The ALD process further includes a second precursor. The second precursor is reactive with the intermediate entity formed by the first metal precursor. The second precursor may be a fluorinated precursor. In some embodiments, the second precursor is selected from the group consisting of HF, HF-pyridine, $WF_6$, $TaF_5$, $MoF_6$, and $NbF_5$.

In one embodiment, each ALD process consists of a cycle, which may be repeated to form a supercycle, with a first metal precursor vapor pulse, such as calcium amidinate ($[Ca(amd)_2]_2$) (e.g., for 3 seconds), for a first precursor exposure (e.g., for 3 seconds); followed by a first metal precursor purge (e.g., for 15 seconds), such as where the reactor is pumped to a vacuum; followed by a second precursor pulse, such as hydrogen fluoride (e.g., for 1 second), with a second precursor exposure (e.g., for 1 second); followed by a second precursor purge (e.g., for 10 seconds). It should be appreciated that the precursor dose and purge time is based on the self-limiting behavior of the precursors. This can be varied in wide range from a few milliseconds to 10 s of seconds. Further if a longer dose then purge time is utilized, the times may need to increase to avoid a CVD type reaction, which can results in non-uniformity and particles formation.

It should be appreciated that more complicated ALD schemes can be constructed as a super-cycle comprising various sub-cycles for depositing a material as described or for depositing multiple different materials for multiple dopants or formation of bi- (tri-, etc.) metallic materials, such as varying the parameters for any of the individual steps within a cycle. In one embodiment, the deposition may be a doped layer or a mixed metal composite.

The respective pulse and exposures may be the same time or pulse may be for a shorter time than the overall exposure.

In some embodiments, the first precursor is a vapor and the first precursor pulse comprises input to the reactor of a first precursor vapor for a first metal precursor pulse time of a few milliseconds to 10 s of seconds (e.g., 0.5, 1, 5, 10, 20, or 30 seconds, inclusive of all ranges and values therebetween), such as 3 seconds. The first partial pressure of the first precursor pulse can be in the range of 0.01-1000 Torr (e.g., 10, 25, 50, 75, 100, 500, or 1000 Torr, inclusive of all ranges and values therebetween), such as, in one embodiment, at least 0.5-100 Torr, such as 0.88 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is what dictates the diffusion boundary conditions. A carrier gas, such as argon or other non-reactive (with the substrate or the precursors) gas, may be used.

In some embodiments, the first precursor exposure comprises exposing the substrate to the first precursor for a first exposure time and a first partial pressure of the first metal precursor so that the first precursor binds with the substrate or coating from prior ALD cycles on the substrate. In some embodiments, given the short time for the pulse/exposure for this ALD process the pulse lasts the entire exposure until the purge starts with the pulse time and exposure time being the same. The first metal precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1-10 seconds (e.g., about 3 seconds). The first partial pressure of the first metal precursor can be in the range of 0.01-10 Torr (e.g., 0.01, 0.05, 0.1, 0.5, 1.0, 5.0, or 10 Torr, inclusive of all ranges and values therebetween). In some embodiments, the first partial pressure of the first metal precursor is in the range of 0.1-1 Torr (e.g., about 0.88 Torr). A longer dose is needed for high surface area powder/catalysis coatings.

The first precursor purge evacuates unreacted precursor from the reactor. The first precursor purge may be for a first precursor purge time of 0.5-30 seconds (e.g., 0.5, 1, 5, 10, 20, or 30 seconds, inclusive of all ranges and values therebetween), such as 15 seconds. The first precursor purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum.

In some embodiments, the base material can be heated to a predetermined temperature during the ALD process. For example, the first predetermined temperature can be in the range of 50-200° C. (e.g., 50, 60, 70, 80, 90, 100, 110, 120, 130, 140, 150, 160, 170, 180, 190 or 200° C., inclusive of all ranges and values therebetween). In some embodiments, the first predetermined temperature is in the range of 100-300° C. (e.g., 225° C.). Temperature also impacts the overall energy in the system and the performance for diffusion and/or reaction. In an ALD process, the deposition temperature range where more or less same growth as function of growth occurs is referred to as the "ALD window." The ALD reaction should occur at a temperature of the of the precursor sufficient to give constant precursors evaporation rate (i.e., vapor pressure). If vapor pressure is not enough, there may still be layer growth, but the surface coverage will be poor. If vapor pressure is too much, it will waste precursor, and there may be CVD growth if there is not sufficient purge time due to mixing of precursors. The temperature of the layer growth can be as low as subliming temperature of the ALD precursors. For example if precursor sublimes at 150° C. films can also grow around that temperature. But generally layer growth temperature is 25-50° C. higher than precursor sublimation temperature.

The substrate, after reaction with the first metal precursor, is then exposed to a second precursor by a second precursor pulse introducing the second precursor to the reactor and then exposing for the second precursor exposure such that the second precursor reacts with the first metal precursor or, more particularly, with intermediate entity formed by the first metal precursor and the substrate (or ALD coating on the substrate).

In some embodiments, the second precursor pulse comprises input to the reactor of the second precursor vapor for a second precursor pulse time of 0.5-30 seconds (e.g., 0.5, 1, 5, 10, 20, or 30 seconds, inclusive of all ranges and values therebetween), such as 1 second. The first partial pressure of the second precursor pulse can be in the range of 0.01-10 Torr (e.g., 0.01, 0.05, 0.1, 0.5, 1.0, 5.0, or 10 Torr, inclusive of all ranges and values therebetween) such as 0.88 Torr.

In some embodiments, exposing the electrode to second precursor for a second precursor exposure time and a second partial pressure of the second precursor so that the second precursor reacts with the entity formed by the first metal precursor reacting with the substrate (or previous ALD deposited coatings). The second precursor exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 1 second. The second partial pressure of the second precursor can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the second precursor is in the range of 0.1-1 Torr (e.g., about 0.5 Torr) such as 0.88 Torr.

The second precursor purge evacuates unreacted precursor from the reactor. The second precursor purge may be for a second precursor purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The second precursor purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum. In some embodiments, the second precursor may include one or more of HF, $WF_6$, $TaF_5$, $MoF_6$, $NbF_5$, and hexafluoroacetylacetonate ("hfacac").

Any number of cycles of exposing the base material to the first metal precursor and the second precursor can be performed to reach a thickness of coating or to provide a desired alteration of the substrate properties. In some embodiments, the number of cycles of the ALD process can be in the range of 1-50 (e.g., 1 cycle, 2, 3, 4, 5, 10, 15, 20, 25, 30, 35, 40, 45, or 50 cycles, inclusive of all ranges and values therebetween). $CaF_2$ is an ionic crystal with the fluorite structure. The lattice is a face centered cubic ("FCC") structure with three sub-lattices. The unit cell of the material is most easily described as a simple cubic lattice formed by the $F^-$ ions where a $Ca^{2+}$ ion is contained in every second cube. The remaining empty cubes called as interstitial or hollow sites are important for defect formation and diffusion, but also for the accommodation of unwanted impurities like rare earth ions and dopants. The lattice constant is a=5.451 Å. The natural cleavage plane of the crystal is the (111) surface. It is build up from $F^-$—$Ca^{2+}$—$F^-$ triple layers of 3.14 Å distance and is terminated by fluorine ions. Consider the mass per steady state $CaF_2$ ALD cycle is 12 $ng/cm^2$ ($F^-$—$Ca^{2+}$—$F^-$) or growth rate is 0.3 A/cycle (FIG. 2D); therefore, in one embodiment, the process is depositing a partial layer in each cycle of $CaF_2$. This can be tuned based on available reaction sites on the depositing surface and precursor's structure. In one embodiment, $CaF_2$ films can be utilized as a SEE material. For example, the $CaF_2$ film may be deposited on (and within) MCP materials. The MCP may include the $CaF_2$ emissive layer over a resistive layer and in communication with electrodes.

Examples

Experiments investigated the nucleation of ALD $CaF_2$ thin films on ALD alumina by depositing a defined $Al_2O_3$ thin film on QCM crystals prior to $CaF_2$ ALD. FIG. 3A shows the QCM trace for such an experiment, and FIG. 3B shows the MCPC for both precursors (blue and green for [Ca(amd)$_2$]$_2$ and HF, respectively) and the overall mass gain for each cycle (black). In addition, FIGS. 4A-4B show enlarged areas of the QCM trace in FIG. 3A, showing the initial three cycles and a cut-out of the steady-state regime (cycle 55-57).

Thin Film Deposition and Analytic Methods.

The ALD of $CaF_2$ was carried out in a hot-wall viscous flow reactor described elsewhere, using ultrahigh purity Argon (UHP, 99.999%) carrier gas at a mass flow rate of 45 sccm and a background pressure of 0.87 Torr. ALD was performed in the temperature range 75-300° C. while standard depositions were carried out at 225° C. To monitor the growth mechanisms in situ, the reactor was equipped with a quartz crystal microbalance (Maxtek BSH-150 sensor head, housing a single-side polished 6 MHz RC-cut quartz crystal sensor (Phillip Technologies), backside purged). If not stated otherwise, QCM experiments were carried out on $CaF_2$ surface. Prior to the QCM experiments, the QCM surface was coated with ~5 nm ALD $Al_2O_3$ using 50 cycles of trimethylaluminum ("TMA") and $H_2O$ with the timing sequence 1.0 sec-10.0 sec-1.0 sec-10.0 sec for precursor dose and purge length, respectively. The ALD reactor also housed a quadrupole mass spectrometer ("QMS") (Stanford Research Systems, RGA300, differentially pumped and located downstream from the sample/QCM position, separated from the reactor by a 35 μm orifice). Transmittance absorbance Fourier-transform infrared ("FT-IR") spectroscopy was carried out in a similarly equipped, smaller ALD reactor connected to a Nicolet 6700 FTIR (Thermo Scientific) spectrometer. The FTIR sample substrate was a steel mesh loaded with ZrO2 nanoparticles heated to 225° C. The Ca precursor bis(N,N'-di-i-propylformamidinato)calcium (II) dimer, (Strem Chemicals, 99.99%-Ca, [Ca(amd)$_2$]$_2$) was maintained at 131° C. in a stainless steel bubbler, which was connected via stainless steel tubing and a manifold (heated to 145° C. to avoid condensation) to the reactor. The HF-Py (Sigma Aldrich, 98%), TMA, and H$_2$O were kept at room temperature. ALD of CaF$_2$ thin films was accomplished by sequential feeding of [Ca(amd)$_2$]$_2$ and HF-Py, separated by purge steps using Ar. The optimized recipe for [Ca (amd)$_2$]$_2$-purge-HF-Py-purge was as follows: 3.0 sec-10.0 sec-1.0 sec-15.0 sec. As substrates, n-type Si(100), Si(111), fused silica, GCA plates (Incom Inc.), sapphire (Al$_2$O$_3$), MgF$_2$(111) and TiN were used. Sample size was in the range of 2 cm$^2$-3 cm$^2$.

CaF$_2$ thin films were analyzed ex situ using XRR, spectroscopic ellipsometry ("SE"), X-ray diffractometry ("XRD"), XPS, and transmission electron microscopy ("TEM"). Thickness values were obtained from SE (J. A. Woollam Co. Alpha SE). XRR measurements were performed on a Bruker D8 Discovery in the range 0.1-2° (Cu Kα source). Raw data from the XRR measurements were fitted using the software GenX and using stoichiometries obtained from XPS measurements. XPS measurements were carried on a Thermo Fisher k-Alpha+. The XPS spectra were analyzed using the Thermo Fisher Avantage software and were referenced to the C is peak at 284.8 eV. For fitting the 2p peaks, the spin-orbit split doublet areas and full width at half maximum ("FWHM") values were constrained for the respective core level spectra applying a mixed Lorentzian-Gaussian peak shape (mixing factor was 0.3, where 1.0 is a pure Lorentzian and 0.0 is a pure Gaussian fitting). Lift-out TEM lamellae were prepared using a Zeiss 1540XB FIB-SEM and imaged on a 200 keV FEI Tecnai F20ST (S)TEM. MCP Gain measurements (FIG. 10) were carried out in a vacuum chamber using a Keithley picoammeter voltage sources under UV light irradiation (Hg-lamp). All measurements were carried out using the same reference electron generating MCP kept at fixed voltage which give define flux of electrons (input current) on the CaF$_2$ monitor MCP, While the potential across the monitor CaF$_2$-coated MCPs was varied from 0-1200 V, the reference MCP was operated with a voltage gap of 200 V across its front and end panels, being 100 V above the CaF$_2$-coated MCP. The gain was calculated as the ratio of the current collected on the anode divided by the dark current.

Analysis.

From FIG. 3A, a non-steady-state regime with changing slope (i.e., MCPC) can be identified up to ~33 cycles, followed by a linear regime with constant slope. By separating the individual contributions from the Ca precursor exposure and the HF exposure, these two regimes can be separated into four more discreet regimes exhibiting different trends, overall growth rates and, potentially, different growth modes.

Regime I (1-5 cycles) shows an initial, global maximum for MCPC which is explained by a high vapor pressure for both precursors in this cycle (i.e., an high amount of precursor molecules due to non-equilibrium conditions when the valves are opened the first time). In this Regime, the HF exposure also contributes a positive MCPC, which is explained by the formation of AlF$_3$ from Al$_2$O$_3$ and HF according to the reaction equation given below.

$$Al_2O_3 + 6HF \rightarrow 2AlF_3 + 3H_2O \quad (1)$$

As two AlF$_3$ units are formed per Al$_2$O$_3$, this reaction should be identified as a positive mass change in QCM experiments.

Following this, Regime I is characterized by a decreasing MCPC, indicating the loss of reactive surface sites. The above described behavior can be seen in detail in FIG. 3B, where a decreasing MCPC for the HF exposure is identified. Between the second and fifth cycle, $\Delta m^{HF}$ approaches 0.0 ng cm$^{-2}$ cycle$^{-1}$, indicating that the mass gain from AlF$_3$ formation and mass loss from CaF$_2$ formation are of the same value and balance each other out.

Regime II (6$^{th}$-33$^{rd}$ cycle) is characterized by a gradual increase in MCPC for the Ca-exposure and a gradual decrease in MCPC for the HF exposure, which both stabilize in a plateau. In this Regime, the maximum negative MCPC (mass loss) during the HF exposure was found to be −24.0 ng cm$^{-2}$ cycle$^{-1}$, whereas the maximum positive MCPC for the Ca exposure is of 40.0 ng cm$^{-2}$ cycle$^{-1}$, yielding a total MCPC of 13.0 ng cm$^{-2}$ cycle$^{-1}$. Both trends support each other and suggest that with an increased amount of Ca-precursor chemisorbed to the surface, more HF can transform Ca-amd species to CaF$_2$. Vice versa, the more CaF$_2$ is growing, the more Ca-amd can chemisorb on the surface. This can already be seen during the first three cycles (FIG. 3B).

Regime III resembles a transition phase with decreased mass loss (HF exposure) and mass gain (Ca exposure) and a total mass gain of 10.0 ng cm$^{-2}$ cycle$^{-1}$, which is pursued in Regime IV, the steady-state growth regime. That the previous reached plateau of Regime II is not the final steady-state MCPC indicates that the film is agglomerating during these initial 40 cycles. It is assumed that this CaF$_2$-ALD process exhibits an island-growth mode before a closed layer is formed. Assuming island-growth explains the increasing negative MCPC for HF exposures in Regime II. Until a closed layer is formed, the formation of AlF$_3$ (mass gain) and CaF$_2$ (mass loss) compete with each other. Once a dense layer of CaF$_2$ is formed, no further mass gain from AlF$_3$ should contribute to the QCM measurement and only mass loss from CaF$_2$ formation should be observed. The formation of a closed CaF$_2$ can be seen in the transient Regime III. Enlarged details of the steady-state growth are shown in FIG. 4B. With the HF exposure, an immediate mass loss is accompanied, suggested the removal of the heavy amidinate ligands from the Ca-precursor fragments on the surface ad replacement with fluorine anions.

Figure 5:
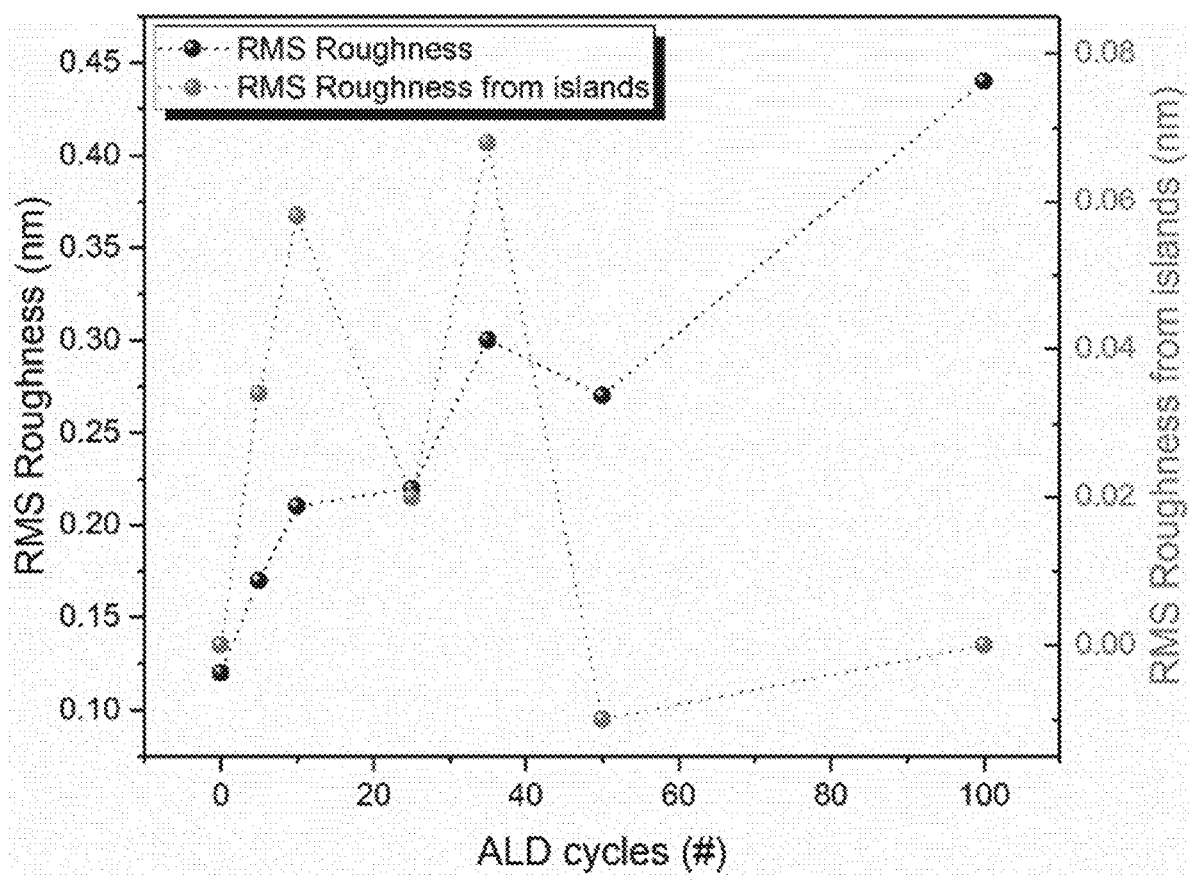
FIG. 5 shows root-mean-squared ("RMS") roughness obtained from atomic force microscopy ("AFM") images.
Figure 6A:
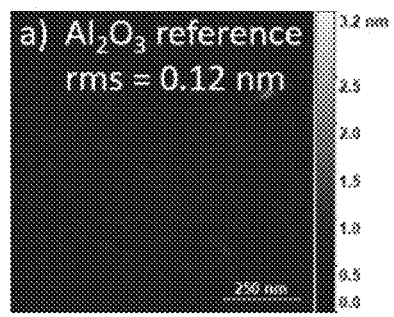
FIGS. 6A-6G are AFM images of $CaF_2$ thin films deposited on 18 nm ALD $Al_2O_3$.
Figure 6B:
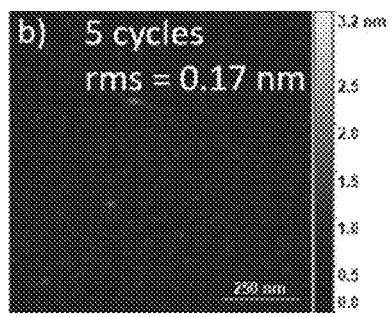
Figure 6C:
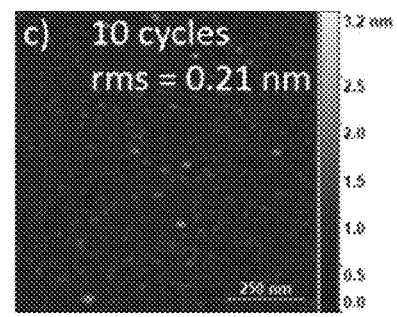
Figure 6D:
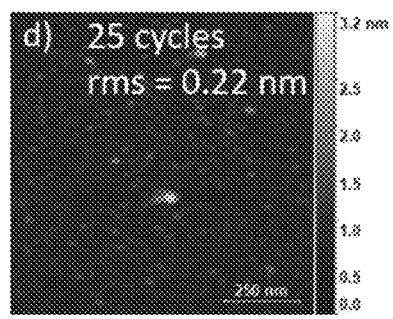
Figure 6E:
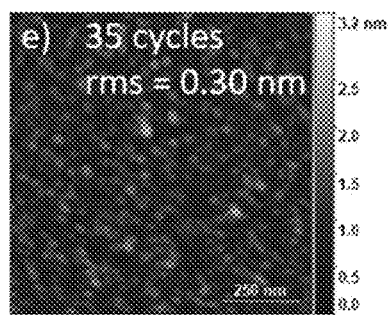
Figure 6F:
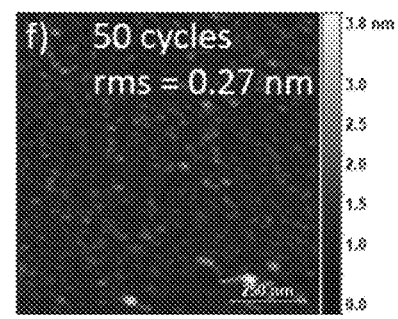
Figure 6G:
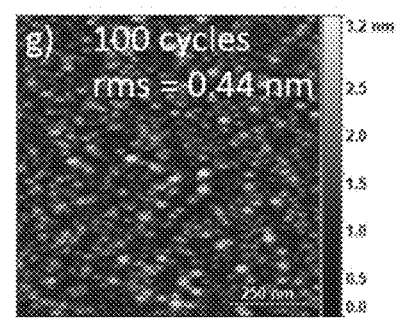
Figures 12A, 12B:
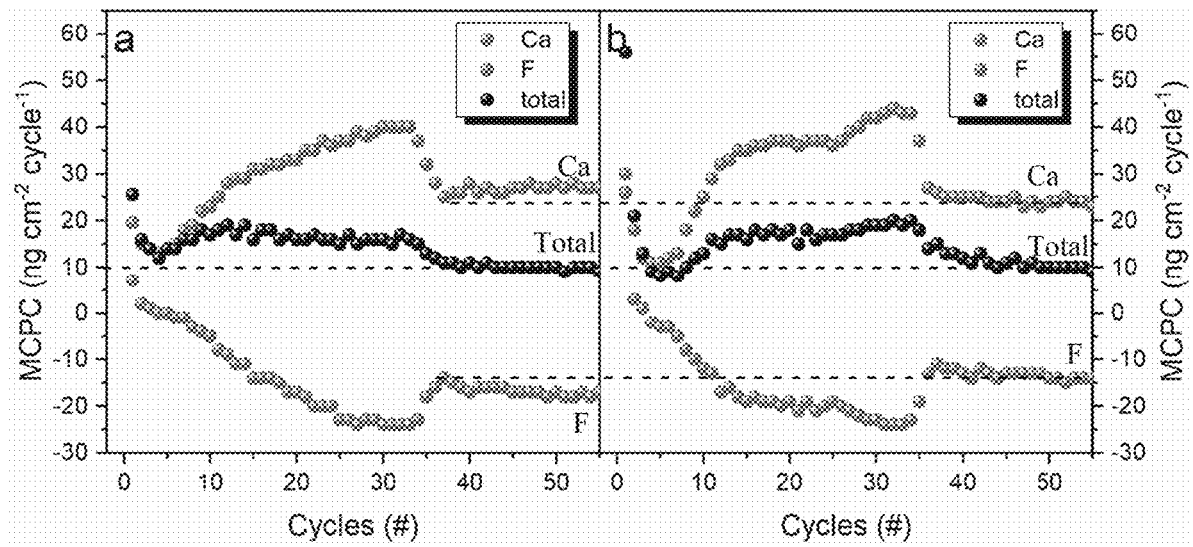
FIGS. 12A-12B show repeated QCM studies during nucleation of $CaF_2$ ALD on an $Al_2O_3$ coated QCM crystal. A feeding sequence of 3.0 sec-15.0 sec-1.0 sec-10 sec was applied at 225° C. in both cases.

A higher, overall MCPC in Regime II can be explained with a rougher surface (islands), having a higher active surface area than the finally closed layer, and thereby providing more reactive surface sites. The growth of CaF$_2$ was investigated using the here presented process several times and found identical values for different runs (FIGS. 12A-12B). The nucleation was further examined using AFM and FIGS. 6B-6G show AFM images of the different growth Regimes. For AFM imaging, CaF$_2$ ALD was carried out on ALD grown Al$_2$O$_3$(18 nm) on silicon to provide a similar surface as during QCM experiments. The RMS roughness increases slightly from 0.12 nm (Al$_2$O$_3$ surface reference) to 0.44 nm for the 100 cycle sample. Already for 5 cycles, granular shapes can be observed on the surface, making it distinct from the reference sample (FIG. 12A). With the MGPC being rather low for this process, it is likely that this image shows contribution from CaF$_2$ growth and Al$_2$O$_3$/AlF$_3$ etching. For 10 and 25 cycles (Regime II), the roughness is virtually identical but higher as for 5 cycles. Also, the grain diameter is of about 10-20 nm. For all these three samples, dark regions, corresponding to open voids, are identified, indicating a not completely closed layer of $CaF_2$. For 35 cycles (Regime III), these voids do not contribute significantly to the surface appearance and the roughness increased to 0.3 nm. Granular shapes are of 20-30 nm in diameter, indicating that island-like growth took place and a closed layer of $CaF_2$ is formed. For 50 cycles, the roughness (0.27 nm) is similar compared to the 35 cycle deposition. These findings match perfectly with the above discussed results and mechanisms from in situ QCM studies and corroborate our interpretation. After 50 and 100 cycles, the ALD $CaF_2$ film shows an RMS-roughness of 0.44 nm and grains sizes increased to 20-50 nm, suggesting increases nucleation and fast growth. FIG. 5 shows the RMS-roughness plotted against ALD cycles.

By subtracting this linear component, the RMS-roughness from island-growth is obtained (FIG. 5, black dots). Matching the assumption of island-growth, the RMS-roughness increases initially, then decreases back to zero. The trend in RMS-roughness from island-growth correlates perfectly with the trend of MCPC values from QCM studies. A similar behaviour was observed for the nucleation of amorphous tungsten on $Al_2O_3$, indicating that the subtraction of a linear component for the ALD $CaF_2$ thin films helps to correlate the respective data.

Lee, et al., have described a convincing mechanism for the ALD of metal fluorides employing HF as fluorine source together with various metalorganic precursors. (See LEE, et al., "Atomic Layer Deposition of Metal Fluorides Using HF-Pyridine as the Fluorine Precursor," Chemistry of Materials 28(7), pp. 2022-2032 (2016)). In their studies, the adsorption of HF molecules on the previously formed $MF_x$ (M=Mg, Mn, Zn, Zr, and Hf; x=2 or 4) surface is suggested, acting as fluorine reservoir for the next metal precursor exposure. This prevailing HF than allows the partial removal and substitution of alkylamido, alkyl or alkyl-substituted cyclopentadienyl ligands. It is believed that this mechanism is valid for the recited process as well, although amidinate ligands are removed and substituted by fluorine.

Lee also provided a good approach to calculate the amount of adsorbed HF molecules in dependence of the ratio of $\Delta M_{[Ca(amd)_2]_2}$ and the respective molecular masses of involved species. The ratio of $\Delta M_{[Ca(amd)_2]_2}$ can be described as:

$$\frac{\Delta M_{[Ca(amd)_2]_2}}{MGPC} = \frac{\Delta M_{[Ca(amd)_2]_2}}{\Delta M_{M_{[Ca(amd)_2]_2}} + \Delta M_{HF}} = \frac{\Delta M_{[Ca(amd)_2]_2} - xM_{Hamd}}{\Delta M_{CaF_2}} \quad (2)$$

with $M_{[Ca]}$, $M_{(CaF_2)}$, and $M_{(Hamd)}$ being the molar masses of the respective compounds. The amount of released Hamd during the Ca-precursor exposure x is calculated by:

$$x = \frac{1}{M_{Hamd}} \left[ M_{[Ca(amd)_2]_2} - M_{CaF_2} \frac{\Delta M_{[Ca(amd)_2]_2}}{MGPC} \right] \quad (3)$$

Using values obtained from QCM studies (FIGS. 3A-3B and 4A-4B) and the ratio for $$\frac{\Delta M_{[Ca(amd)_2]_2}}{MGPC}$$

of 2.7, x=0.7. This means there are roughly 0.7 HF molecules adsorbed per previously formed $CaF_2$ unit in each ALD cycle. Lee, et al., correlated the amount of adsorbed HF molecules to the Lewis-acidity of the deposited metal fluorides. In agreement with the definition of Lewis-acidity, metal fluorides such as $ZrF_4$ and $HfF_4$ tend to adsorb more HF (x=2.2-2.4 and 2.2, respectively) than weak Lewis acids like $MgF_2$ and $MnF_2$ (x=0.0). Our results regarding adsorbed HF molecules place the deposited $CaF_2$ thin films close to that from depositing $AlF_3$, which was reported to adsorb 0.8 HF molecules per AlF3 unit. This is contradicting the assumption of $CaF_2$, comprising a metal with low electronegativity, acting as weak Lewis acid. Lee also found that the amount of adsorbed HF varies depending on the ligands within a given class of metal precursors. For $ZrF_4$, x was 2.0 when using tetra-tert-butoxyzirconium ("ZTB") and 2.4 if tetrakis-(diethylamido)-zirconium(IV) was employed.

Based on our results, it is believed that that the organic ligand of metalorganic precursors might influence the affinity of a given metal fluoride surface to accumulate HF molecules. Apart from the concept of Lewis-acidity, the size, charge and bonding situation of the ligand might increase the tendency to adsorb HF molecules. Scheme 1 shows the mechanism of $CaF_2$ ALD using $[Ca(amd)_2]_2$ and HF and the above discussed assumption of adsorbed HF molecules after the formation of $CaF_2$.

The structure and texture of ALD $CaF_2$ was evaluated on different substrates, including sapphire, $MgF_2$, Si(111), and Si(100).

Figure 13:
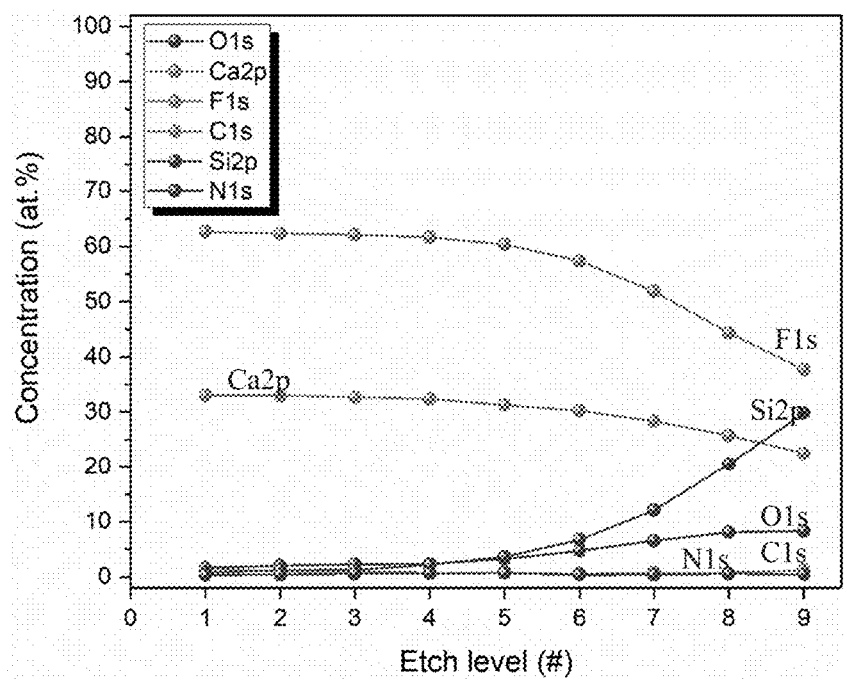
FIG. 13 is a representative X-ray photoelectron spectroscopy ("XPS") depth profile of ALD $CaF_2$ grown on Si(100) at 225° C.

The composition of ALD-grown $CaF_2$ thin films was obtained from XPS. The ideal ratio of F/Ca was found to be 2.0 for films deposited at between 175-225° C. and the films were free of carbon after sputtering, while oxygen concentrations were around 4.7 at. %. Annealing the films at 400° C. decreased the oxygen concentration to 4.4 at. %. Details of XPS results are listed in Table 1 below. The composition stayed constant throughout the bulk of the thin films (see XPS depth profile, FIG. 13). The homogeneity of the deposition with respect to composition was mapped using HAADF imaging in a STEM FIG. 14.

TABLE 1

Composition of $CaF_2$ thin films for as-deposited and annealed ($N_2$, 400° C.) samples. n.d. = not detected.

| | | Concentration (at. %) | | | | | |
|---|---|---|---|---|---|---|---|
| | | Ca | F | O | C | N | F/Ca |
| As deposited (175° C.) | Surface | 27.9 | 57.6 | 4.6 | 9.9 | n.d. | 2.1 |
| | Sputtered | 32.0 | 62.2 | 8.5 | n.d. | n.d. | 1.9 |
| As deposited (200° C.) | Surface | 29.2 | 61.3 | 3.2 | 6.3 | n.d. | 2.1 |
| | Sputtered | 31.4 | 62.6 | 6.0 | n.d. | n.d. | 2.0 |
| Annealed | Surface | 24.0 | 45.2 | 5.3 | 24.0 | 1.5 | 1.9 |
| | Sputtered | 31.2 | 64.5 | 4.4 | n.d. | n.d. | 2.1 |

Figure 7:
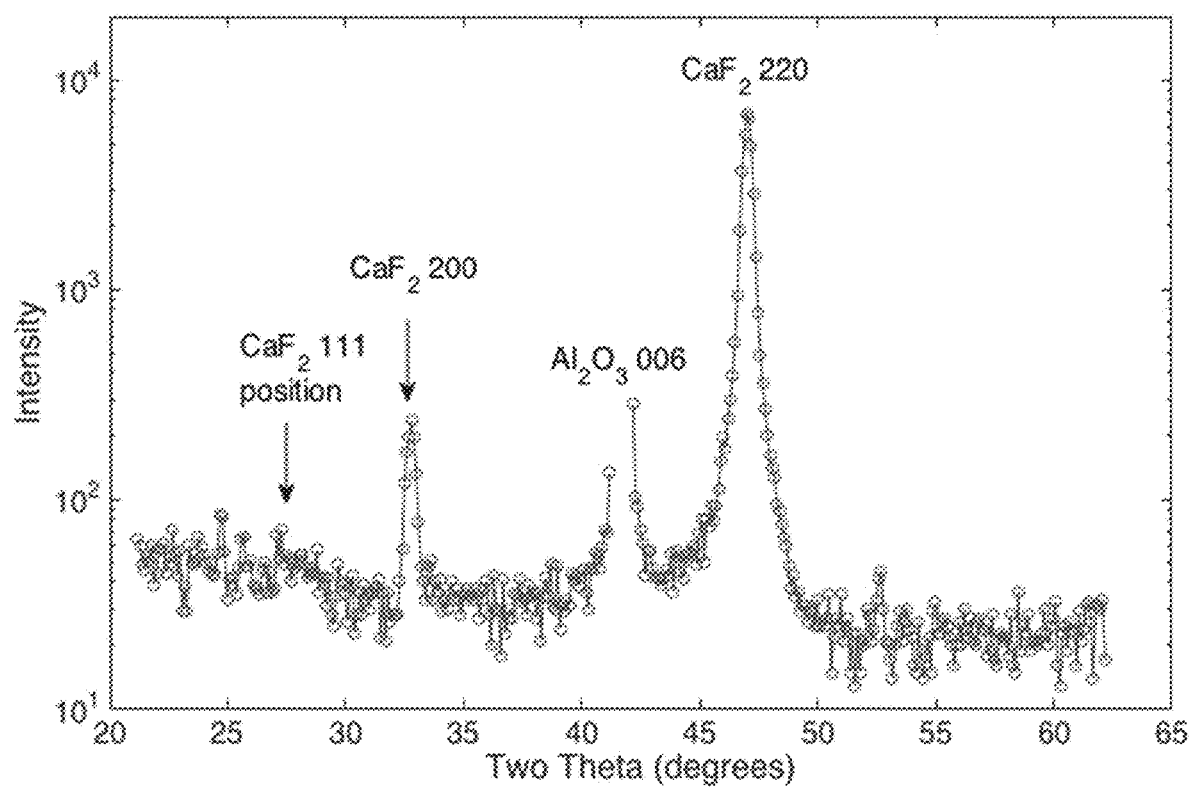
FIG. 7 is a XRD of the $CaF_2$ layer.
Figures 8A, 8B, 8C, 8D, 8E, 8F:
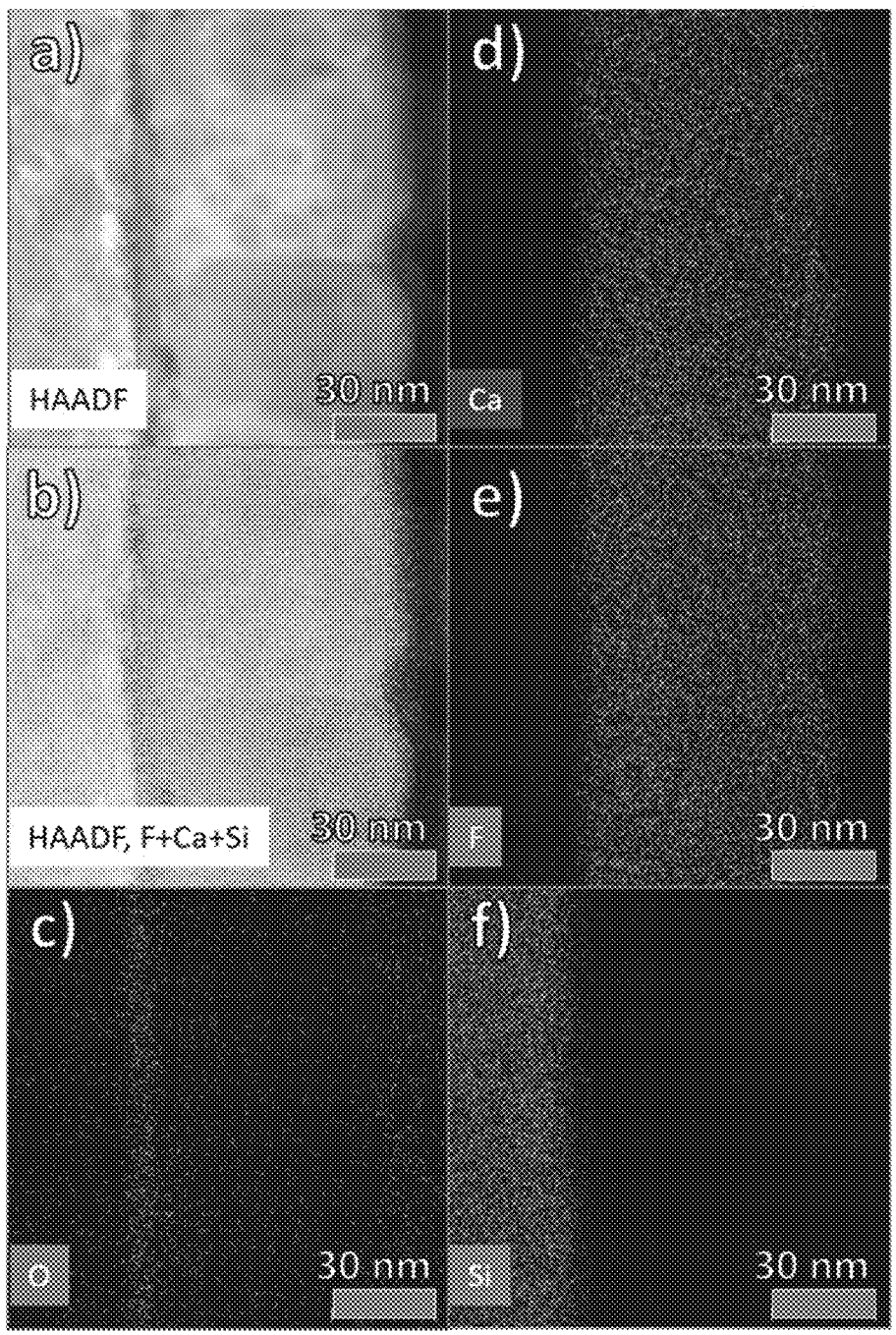
FIGS. 8A-8F are high-angle annular dark-field ("HAADF") spectra from scanning transmission electron microscope ("STEM") experiments on ALD $CaF_2$ thin film deposited at 225° C. on Si(100).

FIG. 8A shows the HAADF image of a representative, enlarged interface region of a cross-cut sample of 77 nm thickness. FIGS. 8B-8E show the images obtained from scattered electrons with respect to the elements of interest (i.e., Si, O, Ca, and F, respectively), and FIG. 8F is a hypermap of the three elements Si, Ca, and O. The HAADF experiments reveal the formation of a sharp interface with the native silicone oxide and a highly homogenous distribution of Ca and F. Matching XPS results, minor oxygen impurities are seen in FIG. 8B. The structure of the ALD grown $CaF_2$ was investigated using X-ray diffraction, which revealed polycrystalline thin films with a predominant orientation in the CaF$_2$ (111) direction (FIG. 7). These findings were corroborated by TEM. FIG. 8A shows a TEM image of as deposited CaF$_2$, and the material was found to be crystalline throughout the whole film. Interestingly, large single-crystalline domains were identified, indicating the growth of high-quality CaF$_2$ thin films.

Figures 2A, 2B:
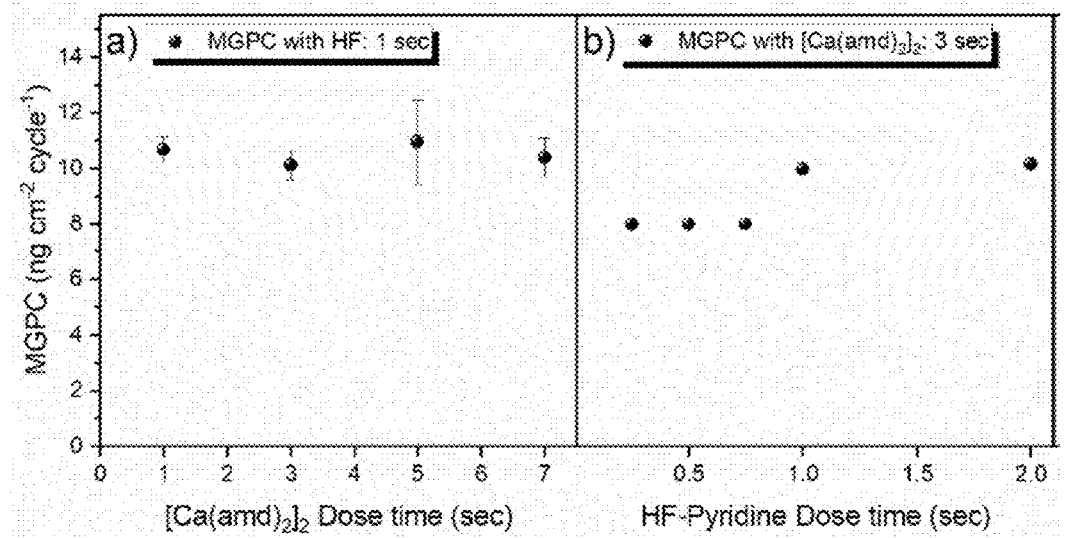
FIGS. 2A-2D show quartz crystal microbalance ("QCM") studies on the $[Ca(amd)_2]_2$-HF ALD process.
Figures 2C, 2D:
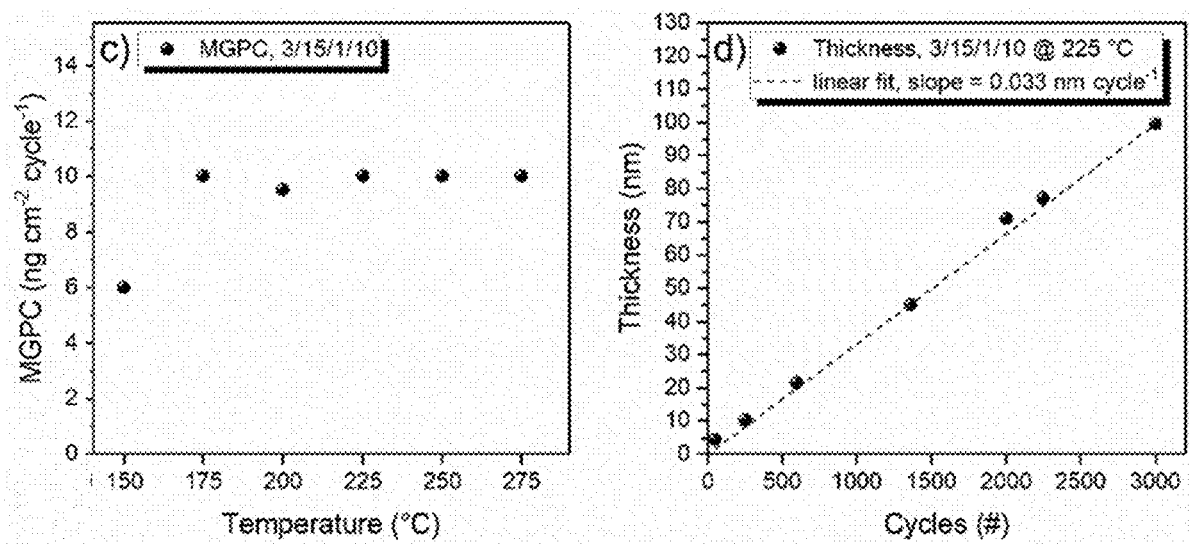

FIGS. 2A-2D show the MGPC for saturation studies of the two precursors (FIGS. 2A and 2B for [Ca(amd)$_2$]$_2$ and HF, respectively), the MGPC vs. temperature (FIG. 2C) and the overall thickness of CaF$_2$ films vs. number of ALD cycles (FIG. 2D).

Figure 11:
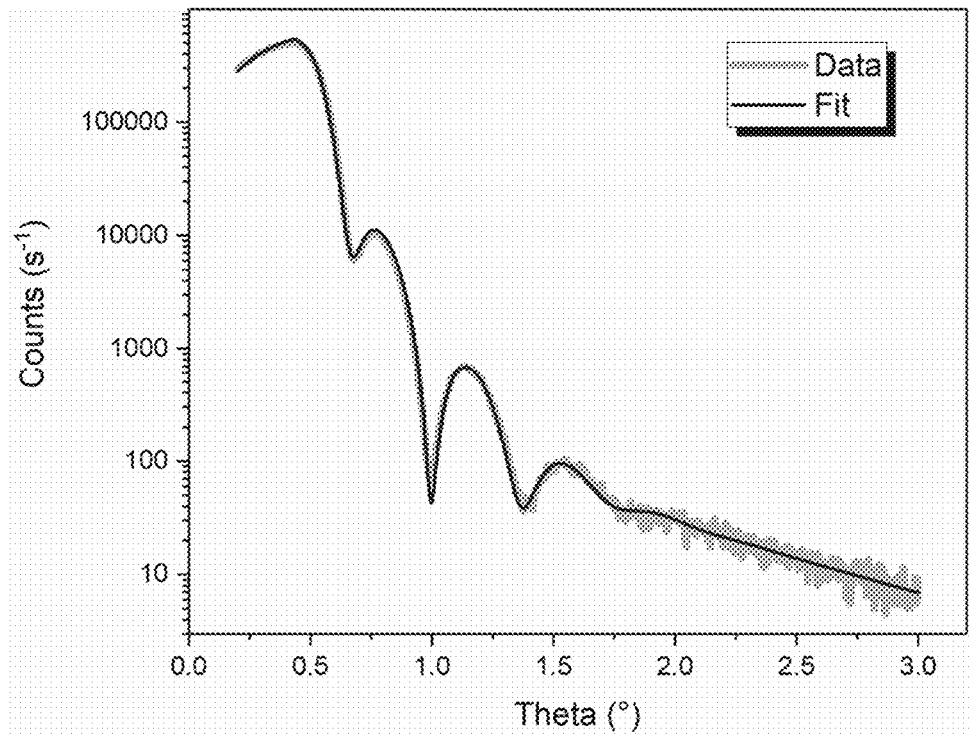
FIG. 11 is a plot of X-ray reflectivity ("XRR") data and the corresponding fit for an as-deposited $CaF_2$ ALD thin film, deposited at 225° C. on Si using [Ca] and HF-PY applying 2250 cycles.

FIGS. 2A and 2B show self-limiting MGPC values of (11.03±0.76) ng cm$^{-2}$ cycle$^{-1}$ and (10.08±0.11) ng cm$^{-2}$ cycle$^{-1}$ for the Ca and HF precursor, respectively, with a dose time of 1.0 second for [Ca(amd)$_2$]$_2$ and HF being sufficient to achieve ALD-like growth. From FIG. 2C, a broad ALD window (i.e., the MGPC being independent of the substrate temperature) can be seen, ranging from 175-275° C. with an average value of (9.9±0.2) ng cm$^{-2}$ cycle$^{-1}$. It should be noted that other ALD processes for CaF$_2$ thin films are usually operated at temperatures around/between 225-400° C. FIG. 2D shows a clear linear trend of film thickness vs. the applied number of ALD cycles (3 sec.-15 sec.-1 sec.-10 sec.) and the slope of the linear fit yields a growth rate per cycle (GPC) of 0.034 nm cycle$^{-1}$. Taking into account the MGPC from saturation studies and the ALD window investigation, an average MGPC of (10.34±0.61) ng cm$^{-2}$ cycle$^{-1}$ was obtained. According to:

$$\rho = \frac{MGPC}{GPC} \quad (1) \qquad (4)$$

where $\rho$ is the density of the deposited material, the density of was calculated to be (3.04±0.18) g cm$^{-3}$. The density was also calculated from XRR data, shown in FIG. 11. From this, a density of 3.14 g cm$^{-3}$ was obtained, matching literature values (3.18 g cm$^{-3}$) for cubic, crystalline CaF$_2$ closely.

With respect to a potential application of the ALD CaF$_2$ as SEE layer for MCP-detectors, optical window for deep UV filters for space application. Passivation layer for Ca-ion batteries, or other uses, CaF$_2$ thin films were evaluated regarding their refractive index and extinction coefficient in the UV range (150-250 nm) using a VUV optics system at TRIUMF particle accelerator. The reflectivity was measured as a function of angle for wavelengths. Details of the calculations are described above in Eqs. 2 and 3. The obtained refractive index values for different wavelengths are summarized in Table 2 below.

TABLE 2

Refractive index and extinction coefficient for CaF$_2$ (77 nm on Si) at different wavelengths in the UV range.

| | As-deposited | | Annealed | |
|---|---|---|---|---|
| λ (nm) | n | k | n | K |
| 150 | 1.56 ± 0.02 | 0.011 ± 0.002 | 1.56 ± 0.02 | 0.011 ± 0.002 |
| 160 | 1.58 ± 0.02 | 0.0027 ± 0.001 | 1.58 ± 0.02 | |
| 165 | 1.58 ± 0.02 | 0.010 ± 0.002 | 1.58 ± 0.02 | |
| 170 | 1.58 ± 0.02 | 0.0073 ± 0.002 | 1.58 ± 0.02 | |
| 175 | 1.60 ± 0.02 | 0.0043 ± 0.002 | 1.60 ± 0.02 | |
| 180 | 1.41 ± 0.05 | 0.028 ± 0.005 | 1.41 ± 0.05 | |
| 193 | 1.45 ± 0.02 | 0.020 ± 0.005 | 1.45 ± 0.02 | |
| 200 | 1.45 ± 0.02 | 0.016 ± 0.05 | 1.45 ± 0.02 | |
| 250 | 1.32 ± 0.05 | failed | 1.32 ± 0.05 | |

Figure 9:
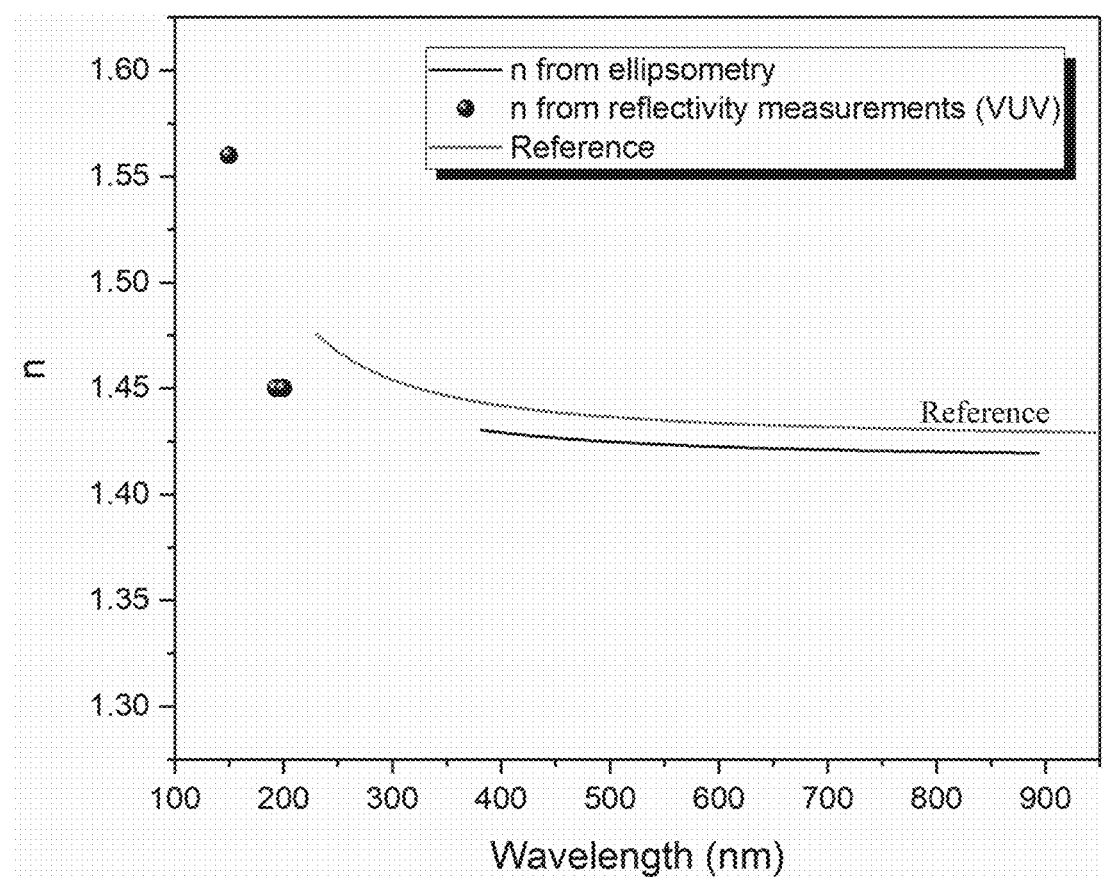
FIG. 9 shows the refractive index of ALD $CaF_2$ in the ultraviolet ("UV") and visible range. Data points in the UV range were obtained from reflectivity measurements while values for n in the visible range were obtained from ellipsometry.

FIG. 9 shows the refractive index n for ALD CaF$_2$ in the UV (selected values) and visible range. The two different measurements demonstrate the same trend, with the refractive index decreasing monotonically with increasing wavelength. The overall low refractive index makes this material promising for optical applications (e.g., such as VUV reflecting coatings, if combined with a material of higher refractive index (e.g., LaF$_3$).

Figure 10:
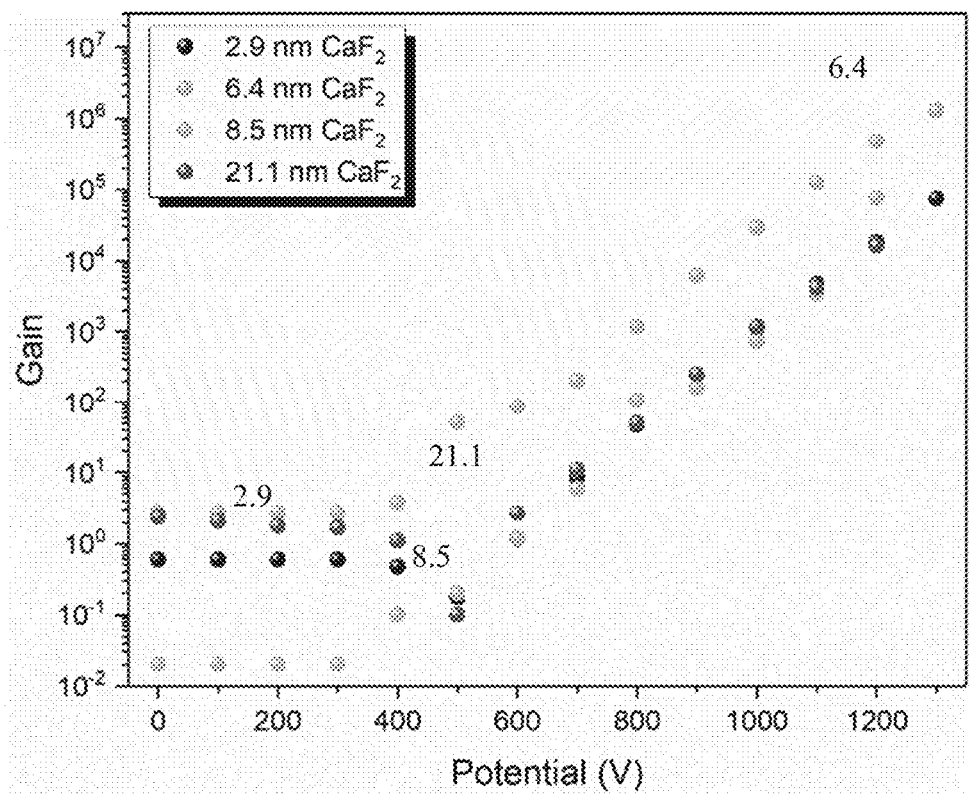
FIG. 10 shows electron signal gain of $CaF_2$-coated microchannel plates ("MCPs").

The CaF$_2$ ALD process was further applied to MCP structures, which were readily coated with a resistive coating of W:Al$_2$O$_3$, which is described in detail elsewhere. Results for four CaF$_2$ coatings with varying thickness and respective signal gains are shown in FIG. 10. While all coatings show and increased signal gain increased voltage, the CaF$_2$ coating of 6.4 nm shows the best performance with a total gain >106 at 1300 V bias voltage. This value is close/higher than those reported for established SEE materials such as MgO and Al$_2$O$_3$.

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of forming a secondary electron emissive coating comprising:
    providing a substrate within an atomic layer deposition reactor; and
    depositing a coating of $CaF_2$ by an atomic layer deposition process including at least one cycle of:
        pulsing a first metal precursor comprising an alkaline metal amidinate into the reactor for a first metal precursor pulse time;
        purging the reactor of the first metal precursor;
        pulsing a second precursor comprising a fluorinated compound into the reactor for a second precursor pulse time; and
        purging the reactor of the co-reactant precursor;
    wherein the depositing occurs at a reaction temperature greater than a highest sublimation temperature of the first metal precursor and the second metal precursor and less than 50° C. above the highest sublimation temperature.

2. The method of claim 1, wherein the substrate is an aluminum compound.

3. The method of claim 1, wherein the substrate is $AlF_3$.

4. The method of claim 1, wherein the first metal precursor is $[Ca(amd)_2]_2$.

5. The method of claim 4, wherein the second precursor is selected from the group consisting of HF, HF-pyridine, $WF_6$, $TaF_5$, $MoF_6$, and $NbF_5$.

6. The method of claim 5, wherein the second precursor is HF or HF-pyridine.

7. The method of claim 6, wherein the reaction temperature is less than 200° C.

8. The method of claim 1, wherein depositing the coating comprises at least 10 atomic layer deposition cycles.

9. The method of claim 4, wherein depositing the coating comprises at least 40 atomic layer deposition cycles.

10. The method of claim 1, wherein the reaction temperature is 25° C.-50° C. above the highest sublimation temperature.

* * * * *